(12) United States Patent
Ikeda

(10) Patent No.: US 9,991,698 B2
(45) Date of Patent: Jun. 5, 2018

(54) ELECTROSTATIC PROTECTION CIRCUIT AND SEMICONDUCTOR INTEGRATED CIRCUIT APPARATUS

(71) Applicant: SEIKO EPSON CORPORATION, Tokyo (JP)

(72) Inventor: Masuhide Ikeda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 220 days.

(21) Appl. No.: 14/940,489

(22) Filed: Nov. 13, 2015

(65) Prior Publication Data

US 2016/0149403 A1 May 26, 2016

(30) Foreign Application Priority Data

Nov. 25, 2014 (JP) ................................. 2014-237948

(51) Int. Cl.
*H02H 3/22* (2006.01)
*H02H 9/04* (2006.01)
*H05K 1/02* (2006.01)

(52) U.S. Cl.
CPC ............ *H02H 9/046* (2013.01); *H02H 9/041* (2013.01); *H05K 1/0259* (2013.01); *H02H 9/04* (2013.01); *H02H 9/048* (2013.01)

(58) Field of Classification Search
USPC ................................................... 361/56, 111
See application file for complete search history.

(56) References Cited

U.S. PATENT DOCUMENTS

| 7,929,263 | B1* | 4/2011 | Peachey | H02H 9/046 361/56 |
| 8,879,222 | B2* | 11/2014 | Singh | H02H 9/046 361/111 |
| 2004/0109270 | A1* | 6/2004 | Stockinger | H01L 27/0251 361/56 |
| 2014/0192445 | A1 | 7/2014 | Ikeda | |
| 2015/0162745 | A1 | 6/2015 | Ikeda | |

FOREIGN PATENT DOCUMENTS

| JP | 2009-182119 A | 8/2009 |
| JP | 2014-132717 A | 7/2014 |
| JP | 2015-115338 A | 6/2015 |

* cited by examiner

*Primary Examiner* — Danny Nguyen
(74) *Attorney, Agent, or Firm* — Oliff PLC

(57) ABSTRACT

This electrostatic protection circuit makes it possible for a discharge operation to be started only in the case where a rise in an applied voltage is steep, and for static electricity to be sufficiently released. This electrostatic protection circuit includes a discharge circuit that is connected between a first node and a second node and discharges charge produced by static electricity, a latch circuit that is connected between the first node and the second node and outputs a signal that controls operation of the discharge circuit to the discharge circuit, a switch circuit that is connected to the latch circuit and changes the signal that controls operation of the discharge circuit, and a control circuit that is connected between the first node and the second node and outputs a signal that controls operation of the switch circuit to the switch circuit.

15 Claims, 17 Drawing Sheets

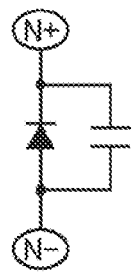
FIG. 23
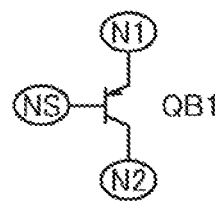    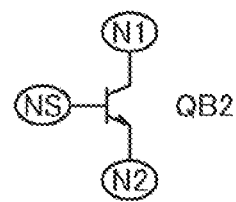
FIG. 24A              FIG. 24B

ELECTROSTATIC PROTECTION CIRCUIT AND SEMICONDUCTOR INTEGRATED CIRCUIT APPARATUS

BACKGROUND

1. Technical Field

The present invention relates to an electrostatic protection circuit that protects an internal circuit of a semiconductor integrated circuit apparatus from ESD (Electro-Static Discharge). Furthermore, the invention relates to a semiconductor integrated circuit apparatus having such an electrostatic protection circuit built therein.

2. Related Art

Semiconductor integrated circuit apparatuses are provided with an electrostatic protection circuit in order to prevent damage to an internal circuit due to static electricity that has accumulated in a human body or a transport machine being applied to the internal circuit. For example, the electrostatic protection circuit is connected between a first terminal that is supplied with a power supply potential on the high potential side and a second terminal that is supplied with a power supply potential on the low potential side. If a positive charge is applied to the first terminal due to an electrostatic discharge, the positive charge is released to the second terminal via the electrostatic protection circuit, thus preventing excessive voltage from being applied to the internal circuit and making it possible to prevent damage to the internal circuit.

As related technology, FIG. 9 of JP-A-2009-182119 shows a known electrostatic discharge protection circuit that is connected between a first power line and a second power line. This electrostatic discharge protection circuit includes a time constant circuit 101 constituted by a resistor and a capacitor that are connected in series between the first power line and the second power line, a discharge circuit constituted by an N-channel transistor 102 that is connected between the first power line and the second power line, and three stages of inverters 103 to 105 whose input sides are connected to connection nodes between the resistor and the capacitor, and whose output sides are connected to the gate of the transistor 102.

In this electrostatic discharge protection circuit, in the case where a positive charge is applied to the first power line, if the rise time of the potential of the first power line is shorter than the time that corresponds to the time constant of the time constant circuit 101, the potential at the connection nodes between the resistor and the capacitor falls to the low level. The potential at the connection nodes between the resistor and the capacitor is maintained at the low level in the period that corresponds to the time constant of the time constant circuit 101. In this period, the gate of the transistor 102 rises to the high level, and the transistor 102 enters the on state. Accordingly, the positive charge applied to the first power line is released to the second power line, and the internal circuit is protected.

In this way, in the electrostatic discharge protection circuit shown in FIG. 9 of JP-A-2009-182119, the start condition and the end condition of the discharge operation are determined by the time constant of the one time constant circuit 101. Accordingly, if the time constant is set such that the discharge operation is started only in the case where a rise in the applied voltage is steep, there is a risk of the duration of the discharge operation being insufficient. On the other hand, if the time constant is set so as to ensure a sufficient duration for the discharge operation, there is a risk of the electrostatic discharge protection circuit mistakenly operating when the power supply voltage rises at the time of power activation.

Also, in the electrostatic discharge protection circuit shown in FIG. 9 of JP-A-2009-182119, current starts to flow through the transistor 102 from an operation region in which the voltage between the first power line and the second power line is lower than the minimum operation voltage of the internal circuit. Accordingly, if the electrostatic discharge protection circuit operates when the power supply voltage rises at the time of power activation, there is a risk of the internal circuit mis-operating. This electrostatic discharge protection circuit needs to be used with a limit placed on the rise time of the power supply voltage at the time of power activation.

Furthermore, JP-A-2014-132717 discloses an electrostatic discharge protection circuit that can cause all of the charge produced by electrostatic discharge to be sufficiently discharged with a simple circuit configuration. This electrostatic discharge protection circuit includes a trigger circuit that has a first circuit and a second circuit that are connected in parallel between a first line and a second line, and a discharge circuit that is connected between the first line and the second line and has a transistor whose gate is directly or indirectly connected to a predetermined connection node of the trigger circuit, and that is turned on by a change in the gate potential.

The first circuit includes a first impedance element and a capacitor element that are connected in series between the first line and the second line, and a first transistor of a first conductivity type that is connected to the first impedance element in series and connected to the capacitor element in parallel. The second circuit includes a second transistor of a second conductivity type and a second impedance element that are connected in series between the first line and the second line. The gate of the second transistor is connected to a first node between the first impedance element and the capacitor element, the gate of the first transistor is connected to a second node between the second transistor and the second impedance element, and the predetermined connection node is the first node or the second node.

In this electrostatic discharge protection circuit, once the second transistor enters the on state due to an electrostatic discharge, the second transistor continues to hold the on state while the potential of the first line is higher than the potential of the second line, regardless of the CR time constant, and the charge applied to the first line due to the electrostatic discharge is released to the second line by the discharge circuit. However, if the electrostatic discharge protection circuit mistakenly starts to operate when the power supply voltage rises at the time of power activation, there is a risk of current continuing to flow as is to the discharge circuit.

JP A-2009-182119 (paragraphs 0003 to 0010, FIG. 9) and JP A-2014-132717 (paragraphs 0017 and 0018, FIG. 1) are examples of related art.

SUMMARY

An advantage of some aspects of the invention is providing an electrostatic protection circuit that makes it possible for a discharge operation to be started only in the case where a rise in an applied voltage is steep, and for a charge applied due to an electrostatic discharge to be released without excess or deficiency. Also, another advantage of the invention is providing an electrostatic protection circuit that makes it possible for a discharge operation to be started only in the case where an applied voltage is a set voltage or higher, and for a charge applied due to an electrostatic discharge to be released without excess or deficiency. Furthermore, yet another advantage of the invention is providing an electrostatic protection circuit that can ensure a certain power supply voltage or higher while also preventing an excessive discharge operation from being performed when the power supply voltage rises at the time of power activation. Additionally, still another advantage of the invention is providing a semiconductor integrated circuit apparatus having such an electrostatic protection circuit built therein.

An electrostatic protection circuit according to an aspect of the invention is an electrostatic protection circuit that is connected to a first terminal via a first node and connected to a second terminal via a second node, and, in a case where static electricity is applied to the first terminal or the second terminal, discharges charge produced by the static electricity, the electrostatic protection circuit including:

a discharge circuit that is connected between the first node and the second node, and discharges the charge produced by the static electricity;

a latch circuit that is connected between the first node and the second node, and outputs a signal that controls operation of the discharge circuit to the discharge circuit;

a switch circuit that is connected to the latch circuit and changes the signal that controls operation of the discharge circuit; and a control circuit that is connected between the first node and the second node, and outputs a signal that controls operation of the switch circuit to the switch circuit.

An electrostatic protection circuit according to another aspect of the invention is an electrostatic protection circuit that is connected to a first terminal via a first node and connected to a second terminal via a second node, the electrostatic protection circuit including: a first impedance element connected between a third node and one out of the first and second nodes; a first capacitor connected between the third node and another one out of the first and second nodes; a second impedance element connected between a fourth node and the one out of the first and second nodes; a second capacitor or a clamping circuit connected between the fourth node and the other one out of the first and second nodes; a first transistor and a second transistor that are connected in series between a fifth node and the one out of the first and second nodes, where if the first node reaches a higher potential than the second node, the first transistor enters a conductive state in accordance with an increase in a potential difference occurring between two ends of the first impedance element, and the second transistor enters a conductive state in accordance with a potential difference occurring between two ends of the second impedance element; a third impedance element connected between the fifth node and the other one out of the first and second nodes; a third transistor that is connected between the fourth node and the other one out of the first and second nodes, and, if the first node reaches a higher potential than the second node, enters a conductive state in accordance with an increase in a potential difference occurring between two ends of the third impedance element; and a discharge circuit that is connected between the first node and the second node, and, if the first node reaches a higher potential than the second node, allows current to flow from the first node to the second node in accordance with an increase in the potential difference occurring between the two ends of the second or third impedance element.

An electrostatic protection circuit according to another aspect of the invention is an electrostatic protection circuit that is connected to a first terminal via a first node and connected to a second terminal via a second node, the electrostatic protection circuit including: a first capacitor connected between a third node and one out of the first and second nodes; a first impedance element connected between the third node and another one out of the first and second nodes; a second impedance element connected between a fourth node and the one out of the first and second nodes; a second capacitor or a clamping circuit connected between the fourth node and the other one out of the first and second nodes; a first transistor that is connected between a fifth node and the one out of the first and second nodes, and, if the first node reaches a higher potential than the second node, enters a conductive state in accordance with an increase in a potential difference occurring between two ends of the second impedance element; a third impedance element connected between the fifth node and the other one out of the first and second nodes; a second transistor and a third transistor that are connected in series between the fourth node and the other one out of the first and second nodes, where if the first node reaches a higher potential than the second node, the second transistor enters a conductive state in accordance with an increase in a potential difference occurring between two ends of the first impedance element, and the third transistor enters a conductive state in accordance with a potential difference occurring between two ends of the third impedance element; and a discharge circuit that is connected between the first node and the second node, and, if the first node reaches a higher potential than the second node, allows current to flow from the first node to the second node in accordance with an increase in the potential difference occurring between the two ends of the second or third impedance element.

In an electrostatic protection circuit according to an aspect of the invention, in the case where a second capacitor is used, a first series circuit constituted by a first impedance element and a first capacitor and a second series circuit constituted by a second impedance element and a second capacitor are provided. Accordingly, a time constant that determines a condition for starting a discharge operation and a time constant that determines a condition for stopping the discharge operation are set individually, and it is possible for the discharge operation to be started only in the case where a rise in an applied voltage is steep, and for a charge applied due to an electrostatic discharge to be released without excess or deficiency.

Here, the time constant of the first series circuit may be larger than the time constant of the second series circuit. Accordingly, it is possible to lengthen the time for which the transistor connected to the first series circuit maintains the conductive state, and for a charge applied due to an electrostatic discharge to be released without excess or deficiency. Also, by causing the transistor connected to the second series circuit to enter the conductive state only in the case where a rise in the applied voltage is steep makes it possible to prevent mis-operation of the electrostatic discharge protection circuit when the power supply voltage rises at the time of power activation.

Furthermore, a configuration is possible in which the time constant of the first series circuit is 200 ns or larger, and the time constant of the second series circuit is 50 ns or smaller. In a human body model, a surge current indicates a large current value for approximately 200 ns from generation, and therefore by setting the time from the start of discharge operation to the stop thereof to 200 ns or longer, it is possible to prevent damage to the internal circuit due to static electricity that has accumulated in the human body being applied to the internal circuit of the semiconductor integrated circuit apparatus. Also, the rise time of the surge current is approximately 10 ns, and therefore if the discharge operation is performed in the case where the rise time of the applied voltage is 50 ns or shorter, it is possible to prevent mis-operation of the electrostatic discharge protection circuit in the case where the rise time of the power supply voltage is longer than 50 ns during normal operation.

In an electrostatic protection circuit according to an aspect of the invention, in the case where a clamping circuit is used, a transition condition used when a transistor connected to the clamping circuit and a third transistor transition from the off state to the on state is determined according to whether or not the voltage between the first node and the second node is greater than or equal to a predetermined voltage. The predetermined voltage is the sum of the clamp voltage of the clamping circuit and the threshold voltage of the transistor connected to the clamping circuit. Accordingly, the time constant that determines the condition for starting the discharge operation and the time constant that determines the condition for stopping the discharge operation are set individually, and it is possible for the discharge operation to be started only in the case where the applied voltage is a set voltage or higher, and for a charge applied due to an electrostatic discharge to be released without excess or deficiency.

In an aspect described above, the electrostatic protection circuit may further include a detection circuit that, if the first node reaches a higher potential than the second node, activates an output signal in accordance with the potential difference occurring between the two ends of the second or third impedance element, and the discharge circuit may allow current to flow from the first node to the second node if the output signal of the detection circuit is activated.

If the detection circuit is not provided, it is necessary to increase the size of the second capacitor or the transistor connected to the second capacitor in order to drive the discharge circuit, but by providing the detection circuit, it is not necessary to increase the size of the second capacitor or the transistor connected to the second capacitor, thus making it possible to reduce the circuit area and cost.

An electrostatic protection circuit according to another aspect of the invention is one of the electrostatic protection circuits described above, further including a fourth impedance element connected between a fifth node and a sixth node, the third impedance element being connected between the sixth node and the other one out of the first and second nodes.

According to this aspect of the invention, the third and fourth impedance elements constitute a voltage-dividing circuit, and therefore even if the power supply voltage rises steeply due to power activation during normal operation, if the voltage between the first node and the second node is smaller than a predetermined voltage, there is no risk of the electrostatic protection circuit starting the discharge operation. Also, once the electrostatic protection circuit starts the discharge operation due to the application of static electricity, if the voltage between the first node and the second node is the predetermined voltage or higher, the electrostatic protection circuit continues the discharge operation for a predetermined time, and thus the voltage between the two ends of the electrostatic protection circuit is held at an approximately constant voltage (hold voltage). Accordingly, it is possible to ensure a certain power supply voltage or higher while also preventing an excessive discharge operation from being performed when the power supply voltage rises at the time of power activation.

Alternatively, in the case of including a detection circuit, the electrostatic protection circuit may further include a fourth impedance element connected between a fifth node and a sixth node, and a fourth transistor that is connected in parallel to the fourth impedance element, and enters a conductive state if the output signal of the detection circuit is activated, and the third impedance element may be connected between the sixth node and the other one out of the first and second nodes.

In this case, once the electrostatic protection circuit starts the discharge operation due to an application of static electricity, a rise occurs in the voltage dividing ratio in the voltage-dividing circuit constituted by the third and fourth impedance elements and the fourth transistor, and therefore the voltage between the first node and the second node decreases, there is a rise in the margin for the voltage at which damage to the internal circuit of the semiconductor integrated circuit apparatus occurs, and the electrostatic resistance improves.

An electrostatic protection circuit according to another aspect of the invention is an electrostatic protection circuit that is connected to a first terminal via a first node and connected to a second terminal via a second node, the electrostatic protection circuit including: a discharge circuit connected between the first node and the second node; a latch circuit that, if static electricity is applied to the first or second terminal, latches a signal that causes the discharge circuit to operate, and outputs the latched signal; a switch circuit that controls the latch circuit; and a control circuit that, after a predetermined time elapses from when the static electricity was applied to the first or second terminal, stops operation of the latch circuit by setting the switch circuit to an off state.

In an electrostatic protection circuit according to an aspect of the invention, a latch circuit that causes a discharge operation to start when static electricity is applied to a first or second terminal is provided, and a control circuit that causes the discharge operation to stop after a predetermined time elapses from when static electricity was applied to the first or second terminal is provided. Accordingly, a condition for starting the discharge operation and a condition for stopping the discharge operation are set individually, and it is possible for the discharge operation to be started only in the case where a rise in the applied voltage is steep or the case where the applied voltage is a set voltage or higher, and for a charge applied due to an electrostatic discharge to be released without excess or deficiency.

An electrostatic protection circuit according to another aspect of the invention is an electrostatic protection circuit that is connected to a first terminal via a first node and connected to a second terminal via a second node, the electrostatic protection circuit including: a first circuit that is connected between the first node and the second node, detects application of a voltage between the first terminal and the second terminal, and discharges charge; and a second circuit that is connected to the first circuit, and, after a predetermined time elapses from when the voltage was applied, stops discharge performed by the first circuit.

Here, the time constant of the second circuit may be larger than the time constant of the first circuit.

A semiconductor integrated circuit apparatus according to one aspect of the invention includes the electrostatic protection circuit according to any of the above aspects of the invention. Accordingly, it is possible to prevent damage to an internal circuit caused by an electrostatic discharge in various types of semiconductor integrated circuit apparatuses.

Alternatively, the semiconductor integrated circuit apparatus may include an internal circuit and the electrostatic protection circuit according to the third aspect of the invention that protects the internal circuit from static electricity, and the hold voltage of the electrostatic protection circuit may be set to a minimum operation voltage of the internal circuit or higher. In this case, even if the electrostatic protection circuit performs the discharge operation due to the influence of power supply noise or the like during normal operation, a power supply voltage greater than or equal to the minimum operation voltage is supplied to the internal circuit, and therefore mis-operation of the internal circuit does not occur. Also, when a time set by the time constant of the first series circuit elapses, the discharge circuit is forcibly set to the off state, and thus the discharge operation stops.

BRIEF DESCRIPTION OF THE DRAWINGS

The invention will be described with reference to the accompanying drawings, wherein like numbers reference like elements.

FIG. 23 is a diagram showing an example of clamping circuits that can be used in embodiments of the invention.

FIG. 24A is a diagram showing example of three-terminal elements other than a MOS transistor that can be used.

FIG. 24B is a diagram showing example of three-terminal elements other than a MOS transistor that can be used.

DESCRIPTION OF EXEMPLARY EMBODIMENTS

Hereinafter, embodiments of the invention will be described in detail with reference to the drawings. Note that like constituent elements are denoted by like reference numbers, and redundant descriptions are omitted.

Figure 1:
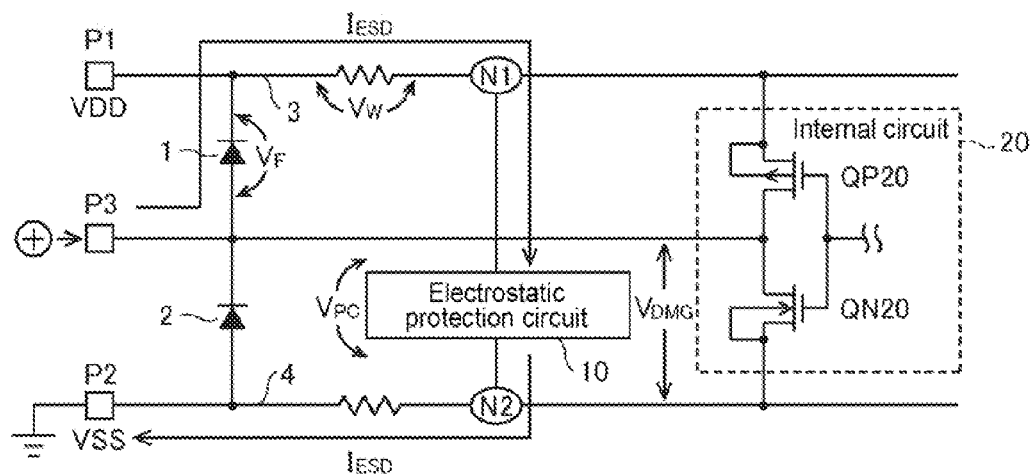
FIG. 1 is a circuit diagram showing an example of a configuration of a semiconductor integrated circuit apparatus having an electrostatic protection circuit built therein.
Figure 2:
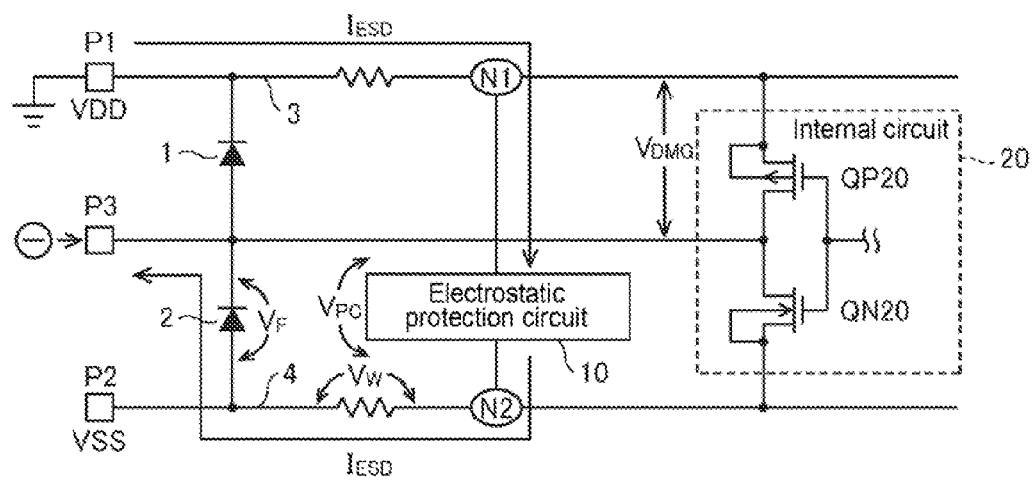
FIG. 2 is a circuit diagram showing an example of a configuration of a semiconductor integrated circuit apparatus having an electrostatic protection circuit built therein.

FIGS. 1 and 2 are circuit diagrams showing examples of the configuration of a semiconductor integrated circuit apparatus that has electrostatic protection circuits according to embodiments of the invention built therein. This semiconductor integrated circuit apparatus includes power supply terminals P1 and P2, a signal terminal P3, diodes 1 and 2, power supply lines 3 and 4, an electrostatic protection circuit 10, and an internal circuit 20. The power supply lines 3 and 4 each have a resistance component. Also, the internal circuit 20 includes a P-channel MOS transistor QP20 and an N-channel MOS transistor QN20.

The electrostatic protection circuit 10 may, for example, be connected between the power supply terminal P1 that is supplied with a power supply potential VDD on the high potential side and the power supply terminal P2 that is supplied with a power supply potential VSS on the low potential side. Also, the electrostatic protection circuit 10 may be connected between the power supply terminal P1 and the signal terminal P3, or may be connected between the signal terminal P3 and the power supply terminal P2. The following embodiments describe, as one example, the case in which the electrostatic protection circuit 10 is connected to the power supply terminal P1 via a node N1 and is connected to the power supply terminal P2 via a node N2, as shown in FIGS. 1 and 2.

If a positive charge is applied to the power supply terminal P2 due to electrostatic discharge, the positive charge is released to the signal terminal P3 via the diode 2, or is released to the power supply terminal P1 via the diodes 2 and 1, thus preventing an excessive voltage from being applied to the internal circuit 20, and making it possible to prevent damage to the internal circuit 20. Accordingly, what is a problem is the case in which a reverse voltage is applied to at least either the diode 1 or the diode 2.

FIG. 1 shows a discharge path in the case in which a positive charge is applied to the signal terminal P3 by an electrostatic discharge, but the power supply terminal P2 is grounded. Due to the electrostatic discharge, a surge current $T_{ESD}$ flows along a path including the diode 1, the power supply line 3, the electrostatic protection circuit 10, and the power supply line 4.

In the discharge operation, if the drain-to-source voltage of the transistor QN20, which is connected in parallel to the diode 2 to which the reverse voltage is applied, is smaller than a damage voltage $V_{DMG}$ at which damage to the transistor QN20 occurs, the electrostatic protection circuit 10 can protect the internal circuit 20. To achieve this, Expression 1 below needs to be satisfied.

$$V_F + V_W + V_{PC} < V_{DMG} \qquad (1)$$

Here, $V_F$ is the forward voltage of the diode 1, $V_W$ is the voltage generated when the surge current $T_{ESD}$ flows through the resistance component of the power supply line 3, and $V_{PC}$ is the voltage generated when the surge current $T_{ESD}$ flows through the electrostatic protection circuit 10.

Also, FIG. 2 shows a discharge path in the case in which a negative charge is applied to the signal terminal P3 by an electrostatic discharge, but the power supply terminal P1 is grounded. Due to the electrostatic discharge, the surge current $T_{ESD}$ flows along a path including the power supply line 3, the electrostatic protection circuit 10, the power supply line 4, and the diode 2.

In the discharge operation, if the source-to-drain voltage of the transistor QP20, which is connected in parallel to the diode 1 to which the reverse voltage is applied, is smaller than the damage voltage $V_{DMG}$ at which damage to the transistor QP20 occurs, the electrostatic protection circuit 10 can protect the internal circuit 20. To achieve this, Expression 2 below needs to be satisfied.

$$V_F + V_W + V_{PC} < V_{DMG} \qquad (2)$$

Here, $V_F$ is the forward voltage of the diode 2, $V_W$ is the voltage generated when the surge current $T_{ESD}$ flows through the resistance component of the power supply line 4, and $V_{PC}$ is the voltage generated when the surge current $I_{RSD}$ flows through the electrostatic protection circuit 10.

As understood from Expressions 1 and 2, the conditions for protecting the internal circuit 20 in the case shown in FIG. 1 and the case shown in FIG. 2 can be represented by the same expression. In other words, the condition for protecting the internal circuit 20 is that the sum of the voltages generated in the devices along the discharge path is smaller than the damage voltage $V_{DMG}$ at which damage to elements in the internal circuit 20 occurs. Providing such an electrostatic protection circuit 10 makes it possible to prevent damage to the internal circuit 20 due to an electrostatic discharge in various types of semiconductor integrated circuit apparatuses.

First Embodiment

Figure 3A:
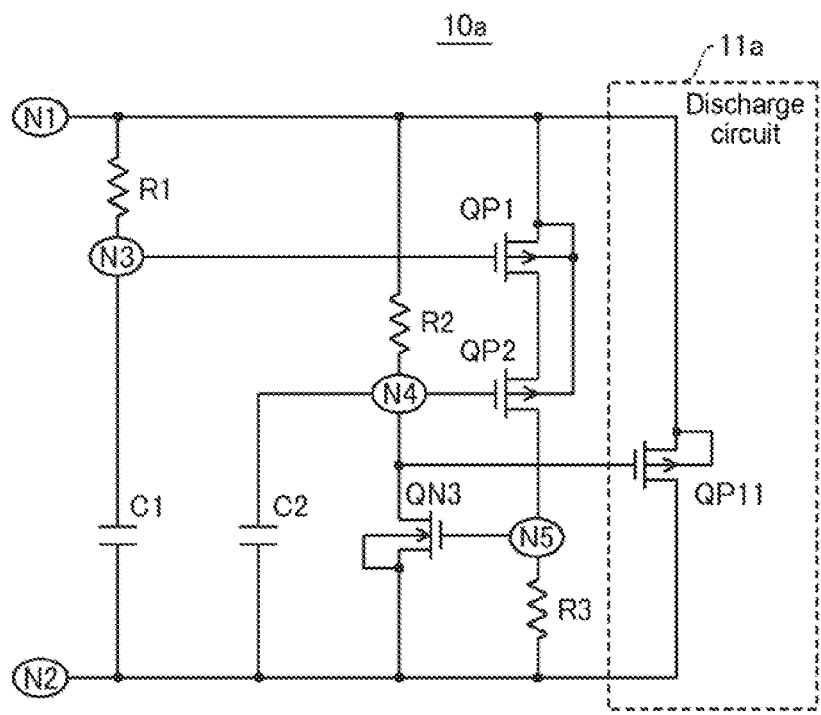
FIG. 3A is a circuit diagram showing an example of a configuration of an electrostatic protection circuit according to a first embodiment of the invention.
Figure 3B:
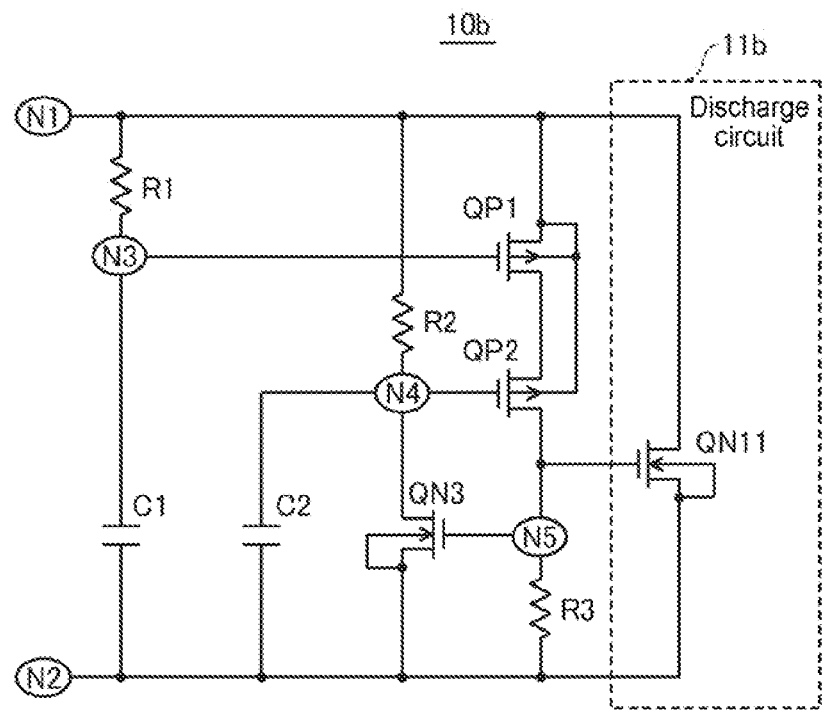
FIG. 3B is a circuit diagram showing an example of a configuration of an electrostatic protection circuit according to the first embodiment of the invention.

FIGS. 3A and 3B are circuit diagrams showing examples of the configurations of electrostatic protection circuits according to a first embodiment of the invention. As shown in FIGS. 3A and 3B, electrostatic protection circuits 10a and 10b of the first embodiment include resistance elements R1 to R3 as first to third impedance elements, capacitors C1 and C2, P-channel MOS transistors QP1 and QP2, an N-channel MOS transistor QN3, and a discharge circuit 11a or 11b.

The capacitors C1 and C2 may each be constituted using multiple electrodes that are each formed by multiple interconnect layers, or may each be constituted using at least one MOS transistor. For example, the capacitor C1 or the C2 can be constituted by using the drain, the source, and the back gate of an N-channel MOS transistor as the first electrode, and using the gate as the second electrode.

The resistance element R1 is connected between the node N1 and a node N3, and the capacitor C1 is connected between the node N3 and the node N2. Also, the resistance element R2 is connected between the node N1 and a node N4, and the capacitor C2 is connected between the node N4 and the node N2.

The transistors QP1 and QP2 are connected in series between the node N1 and a node N5. The transistor QP1 has a source connected to the node N1 and a gate connected to the node N3. The transistor QP2 has a source connected to the drain of the transistor QP1, a drain connected to the node N5, and a gate connected to the node N4. When the node N1 rises to a higher potential than the node N2, the transistor QP1 enters a conductive state (on state) in accordance with the increase in the potential difference occurring between the two ends of the resistance element R1, and the transistor QP2 enters the on state in accordance with the potential difference occurring between the two ends of the resistance element R2.

The resistance element R3 is connected between the node N5 and the node N2. Also, the transistor QN3 is connected between the node N4 and the node N2. The transistor QN3 has a drain connected to the node N4, a source connected to the node N2, and a gate connected to the node N5. When the node N1 rises to a higher potential than the node N2, the transistor QN3 enters the on state in accordance with the increase in the potential difference occurring between the two ends of the resistance element R3.

The discharge circuit 11a or 11b is connected between the node N1 and the node N2, and current flows from the node N1 to the node N2 in accordance with the increase in the potential difference occurring between the two ends of the resistance element R2 or R3. For example, the discharge circuit 11a shown in FIG. 3A includes a P-channel MOS transistor QP11. The transistor QP11 has a source connected to the node N1, a drain connected to the node N2, and a gate connected to the node N4. The transistor QP11 turns on when the potential difference occurring between the two ends of the resistance element R2 rises to a threshold voltage or higher, and current flows from the node N1 to the node N2.

Also, the discharge circuit 11b shown in FIG. 3B includes an N-channel MOS transistor QN11. The transistor QN11 has a drain connected to the node N1, a source connected to the node N2, and a gate connected to the node N5. The transistor QN11 turns on when the potential difference occurring between the two ends of the resistance element R3 rises to a threshold voltage or higher, and current flows from the node N1 to the node N2.

In the present embodiment, a first series circuit constituted by the resistance element R1 and the capacitor C1, and a second series circuit constituted by the resistance element R2 and the capacitor C2 are provided. Accordingly, the time constant that determines the condition for starting the discharge operation and the time constant that determines the condition for stopping the discharge operation are set individually, and it is possible for the discharge operation to be started only in the case where a rise in an applied voltage is steep, and for a charge applied due to an electrostatic discharge to be released without excess or deficiency.

In the following, the time constant of the first series circuit is assumed to be larger than the time constant of the second series circuit. Accordingly, it is possible to lengthen the time for which the transistor QP1 maintains the on state, and for a charge applied due to an electrostatic discharge to be released without excess or deficiency. Also, by causing the transistor QP2 to enter the on state only in the case where a rise in the applied voltage is steep makes it possible to prevent mis-operation of the electrostatic discharge protection circuit when the power supply voltage rises at the time of power activation.

Furthermore, a configuration is possible in which the time constant of the first series circuit is 200 ns or larger, and the time constant of the second series circuit is 50 ns or smaller. In a human body model, the surge current indicates a large current value for approximately 200 ns from generation, and therefore by setting the time from the start of discharge operation to the stop thereof to 200 ns or longer, it is possible to prevent damage to the internal circuit due to static electricity that has accumulated in the human body being applied to the internal circuit of the semiconductor integrated circuit apparatus. For example, if the resistance value of the resistance element R1 is set to 200 kΩ, and the capacitance value of the capacitor C1 is set to 1 pF, the time constant of the first series circuit is 200 ns.

Also, in the human body model, the rise time of the surge current is approximately 10 ns, and therefore if the discharge operation is performed in the case where the rise time of the applied voltage is 50 ns or shorter, it is possible to prevent mis-operation of the electrostatic discharge protection circuit in the case where the rise time of the power supply voltage is longer than 50 ns during normal operation. For example, if the resistance value of the resistance element R1 is set to 50 kΩ, and the capacitance value of the capacitor C1 is set to 1 pF, the time constant of the first series circuit is 50 ns.

The following is a specific description of the operation of the electrostatic protection circuit 10a shown in FIG. 3A.

If a positive voltage is applied between the node N1 and the node N2 (potential of node N1>potential of node N2), current flows from the node N1 to the node N2 via the first series circuit constituted by the resistance element R1 and the capacitor C1. Accordingly, the voltage across the resistance element R1 rises, and charging of the capacitor C1 is performed. The potential of the node N3 rises relative to the potential of the node N2 in accordance with the time constant of the resistance element R1 and the capacitor C1.

Also, current flows from the node N1 to the node N2 via the second series circuit constituted by the resistance element R2 and the capacitor C2. Accordingly, the voltage across the resistance element R2 rises, and charging of the capacitor C2 is performed. The potential of the node N4 rises relative to the potential of the node N2 in accordance with the time constant of the resistance element R2 and the capacitor C2. Because the time constant of the second series circuit is smaller than the time constant of the first series circuit, the speed of the rise of the potential of the node N4 is faster than the speed of the rise of the potential of the node N3.

During normal operation, if the voltage applied between the node N1 and the node N2 rises gradually, the voltage between the node N1 and the node N4 (the voltage across the resistance element R2) remains smaller than the threshold voltage of the transistor QP2, and the transistor QP2 maintains the off state.

On the other hand, if the voltage applied between the node N1 and the node N2 rises steeply during normal operation or due to an electrostatic discharge, the voltage between the node N1 and the node N3 (the voltage across the resistance element R1) rises to the threshold voltage of the transistor QP1 or higher, and the transistor QP1 turns on. Also, the voltage across the resistance element R2 rises to the threshold voltage of the transistor QP2 or higher, and the transistor QP2 turns on. Furthermore, if the voltage across the resistance element R2 rises to the threshold voltage of the transistor QP11 of the discharge circuit 11a or higher, the transistor QP11 starts to allow current to flow from the node N1 to the node N2.

Due to the transistors QP1 and QP2 turning on, current flows through the resistance element R3, and the voltage between the node N5 and the node N2 (the voltage across the resistance element R3) rises from 0 V. Here, if the voltage across the resistance element R3 is smaller than the threshold voltage of the transistor QN3, the transistor QN3 maintains the off state. However, if the voltage across the resistance element R3 rises to the threshold voltage of the transistor QN3 or higher, the transistor QN3 shifts to the on state.

The condition for the transistors QP2 and QN3 transitioning from the off state to the on state is determined by the time constant of the resistance element R2 and the capacitor C2. However, once the transistors QP2 and QN3 enter the on state, the transistors QP2 and QN3 continue to hold the on state while the potential of the node N1 is higher than the potential of the node N2, regardless of the time constant of the resistance element R2 and the capacitor C2.

Due to the transistor QN3 turning on, the amount of current flowing through the resistance element R2 increases, and the voltage across the resistance element R2 rises, and therefore the amount of current flowing through the transistor QP2 increases (positive feedback). Due to the increase in the amount of current flowing through the transistor QP2, the amount of current flowing through the resistance element R3 increases. As a result, the voltage across the resistance element R3 rises, and therefore the amount of current flowing through the transistor QN3 increases (positive feedback). Accordingly, the voltage across the resistance element R2 rises more, and therefore the amount of current flowing through the transistor QP11 of the discharge circuit 11a also increases.

As current continues to flow through the transistor QP11 of the discharge circuit 11a, the charge accumulated in the semiconductor integrated circuit apparatus is released, and the voltage between the node N1 and the node N2 decreases.

Accordingly, the amount of current flowing through the resistance element R2 decreases, and when the voltage across the resistance element R2 falls below the threshold voltage of the transistor QP11 of the discharge circuit 11a, the transistor QP11 transitions from the on state to the off state.

Also, when a time set by the time constant of the first series circuit, which is constituted by the resistance element R1 and the capacitor C1, elapses, the transistor QP1 is forcibly set to the off state, and the discharge operation performed by the transistor QP11 of the discharge circuit 11a stops. Accordingly, during normal operation, even if the power supply voltage is applied between the node N1 and the node N2 and the discharge operation starts, it is possible to stop the discharge operation after a predetermined time has elapsed.

Note that in the case of the electrostatic protection circuit 10b shown in FIG. 3B, if the voltage applied between the node N1 and the node N2 rises steeply, and the voltage across the resistance element R3 rises to the threshold voltage of the transistor QN11 of the discharge circuit 11b or higher, the transistor QN11 starts to allow current to flow from the node N1 to the node N2. Then, when the voltage between the node N1 and the node N2 decreases, and the voltage across the resistance element R3 falls below the threshold voltage of the transistor QN11 of the discharge circuit 11b, the transistor QN11 transitions from the on state to the off state.

Second Embodiment

Figure 4A:
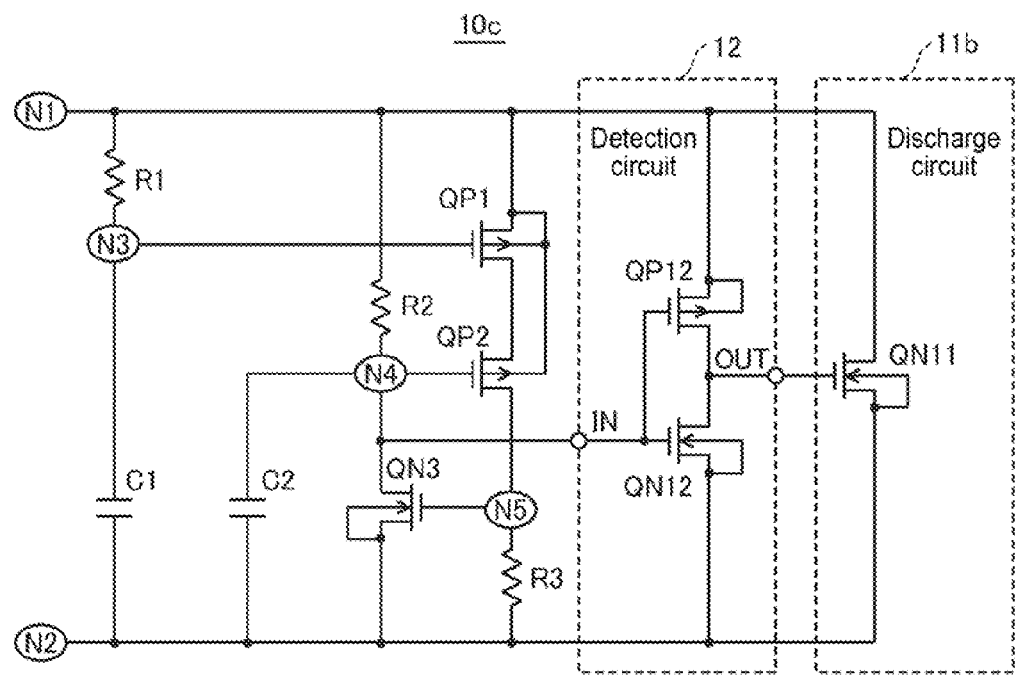
FIG. 4A is a circuit diagram showing an example of a configuration of an electrostatic protection circuit according to a second embodiment of the invention.
Figure 4B:
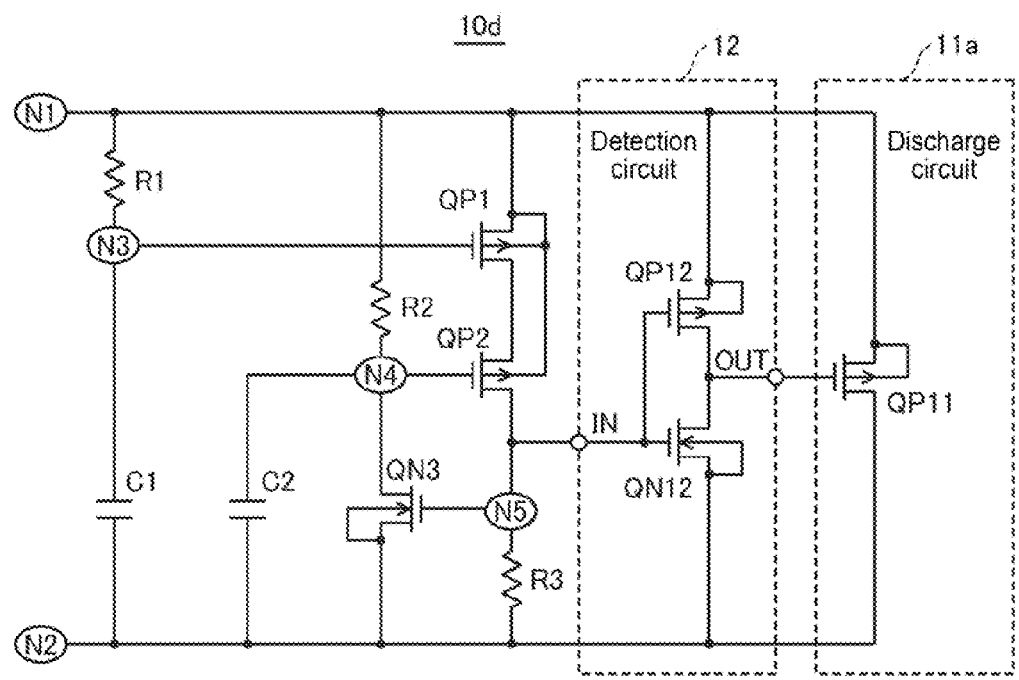
FIG. 4B is a circuit diagram showing an example of a configuration of an electrostatic protection circuit according to the second embodiment of the invention.

FIGS. 4A and 4B are circuit diagrams showing examples of the configurations of electrostatic protection circuits according to a second embodiment of the invention. The electrostatic protection circuits of the second embodiment are the electrostatic protection circuits of the first embodiment with the addition of a detection circuit 12. Other aspects in the second embodiment are similar to those in the first embodiment.

When the node N1 reaches a higher potential than the node N2, the detection circuit 12 activates an output signal in accordance with the increase in the potential difference occurring between the two ends of the resistance element R2 or R3. For example, the detection circuit 12 includes an inverter constituted by a P-channel MOS transistor QP12 and an N-channel MOS transistor QN12. Alternatively, the detection circuit 12 may include multiple inverters that are connected in series.

The transistor QP12 has a source connected to the node N1, a drain connected to an output terminal OUT, and a gate connected to an input terminal IN. Also, the transistor QN12 has a drain connected to the output terminal OUT, a source connected to the node N2, and a gate connected to the input terminal IN.

In an electrostatic protection circuit 10c shown in FIG. 4A, the input terminal IN of the detection circuit 12, which includes an odd number of (one in FIG. 4A) inverters, is connected to the node N4, and the output terminal OUT of the detection circuit 12 is connected to the discharge circuit 11b. On the other hand, if the detection circuit 12 includes an even number of inverters, the discharge circuit 11a is connected to the output terminal OUT of the detection circuit 12.

The detection circuit 12 detects whether the potential of the node N4, which is supplied to the input terminal IN, is at the high level or the low level, inverts the level, and outputs an output signal having the inverted level from the output terminal OUT. Accordingly, the detection circuit 12 activates the output signal with the high level when the voltage across the resistance element R2 rises above a predetermined percentage (e.g., 50%) of the voltage between the node N1 and the node N2. When the output signal of the detection circuit 12 has been activated with the high level, the discharge circuit 11b allows current to flow from the node N1 to the node N2.

In an electrostatic protection circuit 10d shown in FIG. 4B, the input terminal IN of the detection circuit, which includes an odd number of (one in FIG. 4B) inverters, is connected to the node N5, and the output terminal OUT of the detection circuit 12 is connected to the discharge circuit 11a. On the other hand, if the detection circuit 12 includes an even number of inverters, the discharge circuit 11b is connected to the output terminal OUT of the detection circuit 12.

The detection circuit 12 detects whether the potential of the node N5, which is supplied to the input terminal IN, is at the high level or the low level, inverts the level, and outputs an output signal having the inverted level from the output terminal OUT. Accordingly, the detection circuit 12 activates the output signal with the low level when the voltage across the resistance element R3 rises above a predetermined percentage (e.g., 50%) of the voltage between the node N1 and the node N2. When the output signal of the detection circuit 12 has been activated with the low level, the discharge circuit 11a allows current to flow from the node N1 to the node N2.

If the detection circuit 12 is not provided, it is necessary to increase the size of the capacitor C2 or the transistor QP2 in order to drive the discharge circuit 11a or 11b, but by providing the detection circuit 12, it is not necessary to increase the size of the capacitor C2 or the transistor QP2, thus making it possible to reduce the circuit area and cost. Note that besides an inverter, a comparator or the like can be used as the detection circuit 12.

Third Embodiment

Figure 5:
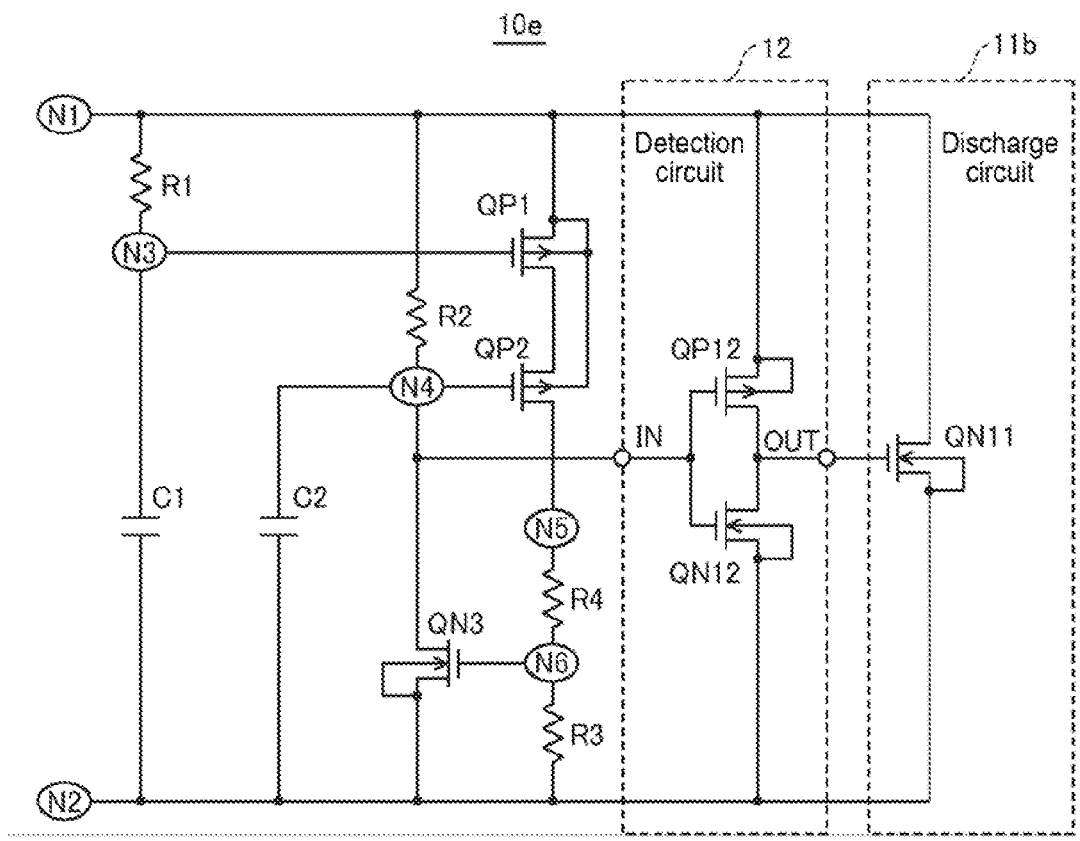
FIG. 5 is a circuit diagram showing an example of a configuration of an electrostatic protection circuit according to a third embodiment of the invention.

FIG. 5 is a circuit diagram showing an example of the configuration of an electrostatic protection circuit according to a third embodiment of the invention. The electrostatic protection circuit of the third embodiment is the electrostatic protection circuit of the first or second embodiment with the addition of a resistance element R4 as a fourth impedance element that is connected between the node N5 and a node N6, and the resistance element R3 is connected between the node N6 and the node N2. Other aspects in the third embodiment are similar to those in the first or second embodiment. The following describes, as one example, the case in which the resistance element R4 has been added to the electrostatic protection circuit 10c shown in FIG. 4A.

The resistance elements R4 and R3 constitute a voltage-dividing circuit that divides the voltage between the node N5 and the node N2. The transistor QN3 has a drain connected to the node N4, a source connected to the node N2, and a gate connected to the node N6. When the node N1 rises to a higher potential than the node N2, the transistor QN3 enters the on state in accordance with the rise in the voltage between the node N6 and the node N2 (the voltage across the resistance element R3).

Specifically, when the voltage across the resistance element R3 rises to the threshold voltage or higher, the transistor QN3 enters the on state and increases the amount of current that flows through the resistance element R2. The detection circuit 12 then activates the output signal with the high level in accordance with the rise in the voltage across the resistance element R2. When the output signal of the detection circuit 12 has been activated with the high level, the discharge circuit 11b allows current to flow from the node N1 to the node N2.

The following is a specific description of the operation of an electrostatic protection circuit 10e shown in FIG. 5.

If a positive voltage is applied between the node N1 and the node N2 (potential of node N1>potential of node N2), current flows from the node N1 to the node N2 via the first series circuit constituted by the resistance element R1 and the capacitor C1. Accordingly, the voltage across the resistance element R1 rises, and charging of the capacitor C1 is performed. The potential of the node N3 rises relative to the potential of the node N2 in accordance with the time constant of the resistance element R1 and the capacitor C1.

Also, current flows from the node N1 to the node N2 via the second series circuit constituted by the resistance element R2 and the capacitor C2. Accordingly, the voltage across the resistance element R2 rises, and charging of the capacitor C2 is performed. The potential of the node N4 rises relative to the potential of the node N2 in accordance with the time constant of the resistance element R2 and the capacitor C2. Because the time constant of the second series circuit is smaller than the time constant of the first series circuit, the speed of the rise of the potential of the node N4 is faster than the speed of the rise of the potential of the node N3.

During normal operation, if the voltage applied between the node N1 and the node N2 rises gradually, the voltage between the node N1 and the node N4 (the voltage across the resistance element R2) remains smaller than the threshold voltage of the transistor QP2, and the transistor QP2 maintains the off state.

On the other hand, if the voltage applied between the node N1 and the node N2 rises steeply during normal operation or due to an electrostatic discharge, the voltage between the node N1 and the node N3 (the voltage across the resistance element R1) rises to the threshold voltage of the transistor QP1 or higher, and the transistor QP1 turns on. Also, the voltage across the resistance element R2 rises to the threshold voltage of the transistor QP2 or higher, and the transistor QP2 turns on. Note that at this time, the potential of the input terminal IN of the detection circuit 12 is at the high level.

Due to the transistors QP1 and QP2 turning on, voltage is applied to the two ends of the voltage-dividing circuit constituted by the resistance elements R4 and R3, and the voltage between the node N6 and the node N2 (the voltage across the resistance element R3) rises from 0 V. Here, if the voltage between the node N1 and the node N2 is smaller than a predetermined voltage, the voltage across the resistance element R3 remains smaller than the threshold voltage of the transistor QN3, and the transistor QN3 maintains the off state. On the other hand, if the voltage between the node N1 and the node N2 is the predetermined voltage or higher, the voltage across the resistance element R3 rises to the threshold voltage of the transistor QN3 or higher, and the transistor QN3 shifts to the on state.

Due to the transistor QN3 turning on, the amount of current flowing through the resistance element R2 increases, and the voltage across the resistance element R2 rises, and therefore the amount of current flowing through the transistor QP2 increases (positive feedback). At the same time, the potential of the input terminal IN of the detection circuit 12 falls to the low level, and the output signal of the detection circuit 12 is activated with the high level. Accordingly, the transistor QN11 of the discharge circuit 11b starts to allow current to flow from the node N1 to the node N2.

Also, due to the increase in the amount of current flowing through the transistor QP2, the amount of current flowing through the resistance elements R4 and R3 increases. As a result, the voltage across the resistance element R3 rises, and therefore the amount of current flowing through the transistor QN3 increases (positive feedback). Accordingly, the voltage across the resistance element R2 rises further. At the same time, the amount of current flowing through the transistor QN11 of the discharge circuit 11b also increases.

As current continues to flow through the transistor QN11 of the discharge circuit 11b, the charge accumulated in the semiconductor integrated circuit apparatus is released, and the voltage between the node N1 and the node N2 falls below the predetermined voltage. Accordingly, the voltage across the resistance element R3 falls below the threshold voltage of the transistor QN3, and therefore the transistor QN3 transitions from the on state to the off state. As a result, the amount of current flowing through the resistance element R2 decreases, and therefore the output signal of the detection circuit 12 is deactivated with the low level, the transistor QN11 of the discharge circuit 11b transitions from the on state to the off state, and the voltage between the node N1 and the node N2 is held at an approximately constant voltage.

Also, when a time set by the time constant of the first series circuit, which is constituted by the resistance element R1 and the capacitor C1, elapses, the transistor QP1 is forcibly set to the off state, and the discharge operation performed by the transistor QN11 of the discharge circuit 11b stops. Accordingly, during normal operation, even if the power supply voltage is applied between the node N1 and the node N2 and the discharge operation starts, it is possible to stop the discharge operation after a predetermined time has elapsed.

In this way, when the transistors QP2 and QN3 transition from the off state to the on state, the transition condition is determined by the time constant of the resistance element R2 and the capacitor C2 as well as the voltage between the node N1 and the node N2. However, once the transistors QP2 and QN3 enter the on state, the transistors QP2 and QN3 continue to hold the on state for a predetermined time while the voltage between the node N1 and the node N2 is higher than the predetermined voltage, regardless of the time constant of the resistance element R2 and the capacitor C2.

Accordingly, even if the power supply voltage rises steeply due to power activation during normal use, if the voltage between the node N1 and the node N2 is smaller than the predetermined voltage, there is no risk of the electrostatic protection circuit 10e starting the discharge operation. Also, once the electrostatic protection circuit 10e starts the discharge operation due to the application of static electricity, if the voltage between the node N1 and the node N2 is the predetermined voltage or higher, the electrostatic protection circuit 10e continues the discharge operation for a predetermined time. As a result, it is possible to ensure a certain power supply voltage or higher while also preventing an excessive discharge operation from being performed when the power supply voltage rises at the time of power activation.

Due to the above-described operation mechanism, current flows through the discharge path while the voltage between the two ends of the electrostatic protection circuit 10e is held at an approximately constant voltage. In this application, the voltage held between the two ends of the electrostatic protection circuit is referred to as the "hold voltage". Also, when a time set by the time constant of the first series circuit, which is constituted by the resistance element R1 and the capacitor C1, elapses, the transistor QP1 is forcibly set to the off state, and the discharge operation stops.

A hold voltage $V_H$ is the voltage between the node N1 and the node N2 when the transistor QN3 transitions from the on state to the off state, and can be approximated by Expression 3 below.

$$V_H \approx Vth_{QN3} \times (R3+R4)/R3 \qquad (3)$$

Here, $Vth_{QN3}$ is the threshold voltage of the transistor QN3, R3 is the resistance value of the resistance element R3, and R4 is the resistance value of the resistance element R4. Note that it is assumed that the resistance values R3 and R4 are values sufficiently larger than the on resistance of the transistors QP1 and QP2. By selecting the resistance values of the resistance elements R3 and R4 in accordance with Expression 3, it is possible to set a desired hold voltage $V_H$.

Figure 6:
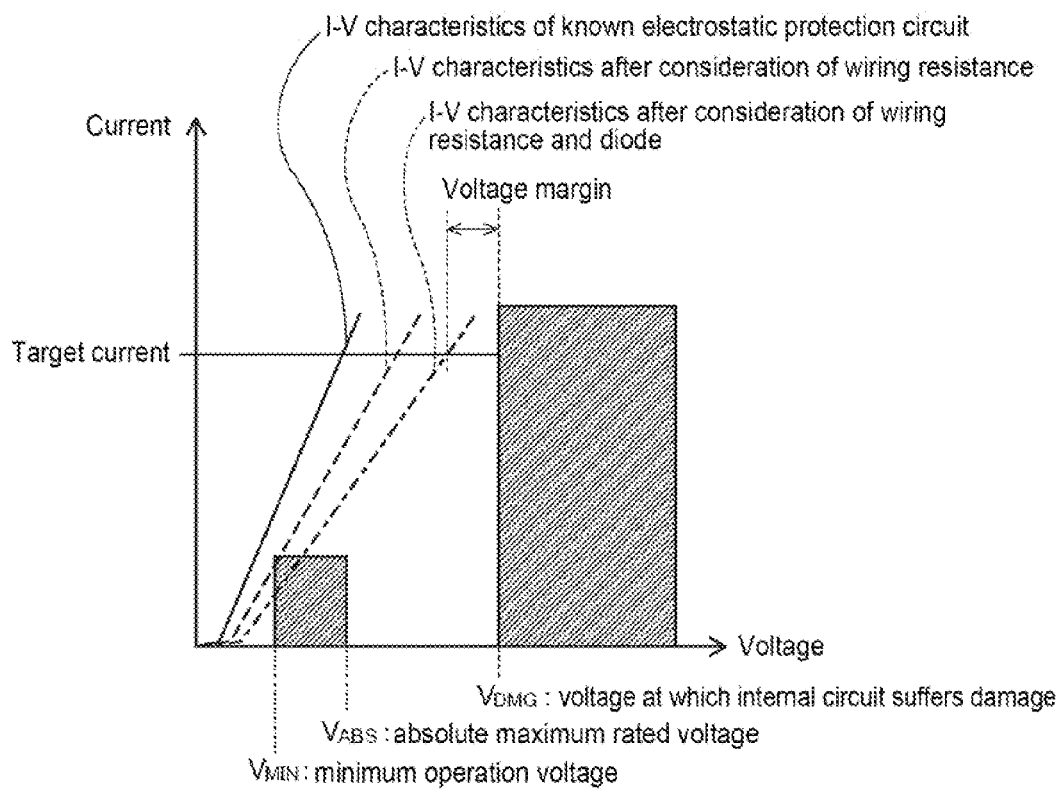
FIG. 6 is a diagram showing the I-V characteristics of a known electrostatic protection circuit.
Figure 7:
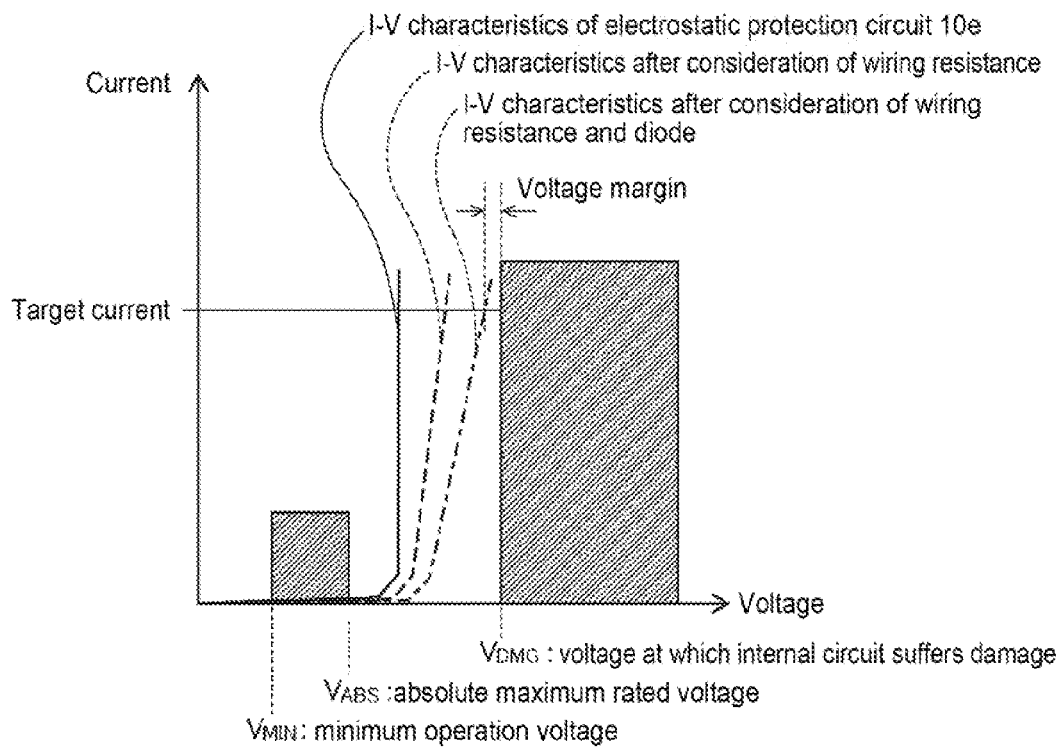
FIG. 7 is a diagram showing the I-V characteristics of the electrostatic protection circuit according to the third embodiment.

FIG. 6 is a diagram showing I-V characteristics in the case of applying a known electrostatic protection circuit to the semiconductor integrated circuit apparatus shown in FIG. 1, and FIG. 7 is a diagram showing I-V characteristics in the case of applying the electrostatic protection circuit of the third embodiment of the invention to the semiconductor integrated circuit apparatus shown in FIG. 1. In FIGS. 6 and 7, the horizontal axis indicates the voltage between the two ends of the electrostatic protection circuit and the like in the discharge path, and the vertical axis indicates the current flowing in the discharge path.

Figure 9:
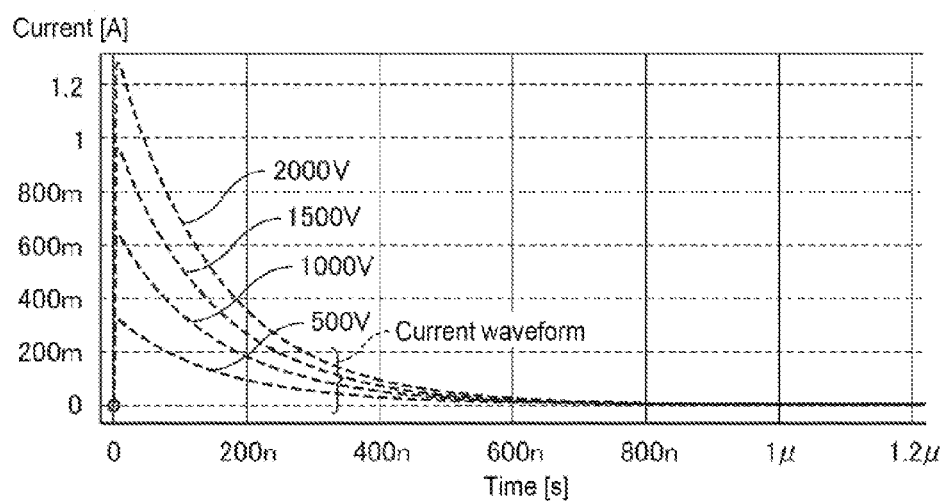
FIG. 9 is a diagram showing a current waveform of electrostatic discharge in a human body model.

The known electrostatic protection circuit shown in FIG. 9 of JP-A-2009-182119 is not provided with a voltage-dividing circuit. In this case, as shown in FIG. 6, current starts to flow in the discharge path from an operation region in which the voltage between the two ends of the electrostatic protection circuit is lower than a minimum operation voltage $V_{MIN}$ of the internal circuit 20. Accordingly, even during normal operation, if the power supply voltage rises steeply due to power being turned on, the electrostatic protection circuit starts the discharge operation, and current flows, and there is a risk of the internal circuit 20 mis-operating. Accordingly, in the case of using the known electrostatic protection circuit, it is necessary to provide a limit on the rising characteristics of the power supply voltage at the time of power activation.

As shown in FIG. 7, with the electrostatic protection circuit 10e (FIG. 5) according to the third embodiment of the invention, the discharge operation is not started in the region in which the voltage between the two ends is an absolute maximum rated voltage $V_{ABS}$ or less, and therefore current does not flow in the discharge path. On the other hand, if the voltage between the two ends exceeds a predetermined voltage $V_P$, the electrostatic protection circuit 10e starts the discharge operation, and current starts to flow in the discharge path. When the current flowing in the discharge path exceeds a predetermined current $I_P$, the electrostatic protection circuit 10e holds the voltage between the two ends at an approximately constant voltage (hold voltage $V_H$). Even giving consideration to the voltage occurring in the wiring resistance and the diode, when the current flowing in the discharge path has reached the target current, a voltage margin exists between the voltage between the terminals of the semiconductor integrated circuit apparatus and the damage voltage $V_{DMG}$ at which damage to the elements in the internal circuit 20 occurs.

Incidentally, recent years have seen a trend of decrease in the difference between the absolute maximum rated voltage $V_{ABS}$ and the damage voltage $V_{DMG}$. Also, giving consideration to variation in the manufacture of semiconductor integrated circuit apparatuses, power supply noise, and the like, there are cases where it is difficult to set the hold voltage $V_H$ between the absolute maximum rated voltage $V_{ABS}$ and the damage voltage $V_{DMG}$. In the present embodiment, the hold voltage $V_H$ may be set lower than the absolute maximum rated voltage $V_{ABS}$ in such a case.

For example, it is sufficient that the hold voltage $V_H$ is set greater than or equal to the minimum operation voltage $V_{MIN}$ of the internal circuit 20. During normal operation, if the electrostatic protection circuit 10e performs the discharge operation due to the influence of power supply noise or the like, current flows in the discharge path while the voltage between the two ends of the electrostatic protection circuit 10e remains at a voltage greater than or equal to the minimum operation voltage $V_{MIN}$. Accordingly, a power supply voltage greater than or equal to the minimum operation voltage $V_{MIN}$ is supplied to the internal circuit 20, thus preventing mis-operation of the internal circuit 20. Also, when a time set by the time constant of the first series circuit, which is constituted by the resistance element R1 and the capacitor C1, elapses, the transistor QP1 is forcibly set to the off state, and the discharge operation stops.

FIGS. 8 to 13 show the results of simulation of the characteristics of the known electrostatic protection circuit of JP-A-2009-182119 shown in FIG. 9 and the electrostatic protection circuit according to the third embodiment of the invention. Here, it is assumed that the absolute maximum rated voltage of the semiconductor integrated circuit apparatus is 7 V, and the voltage at which damage to the internal circuit occurs is 10 V.

Figure 8:
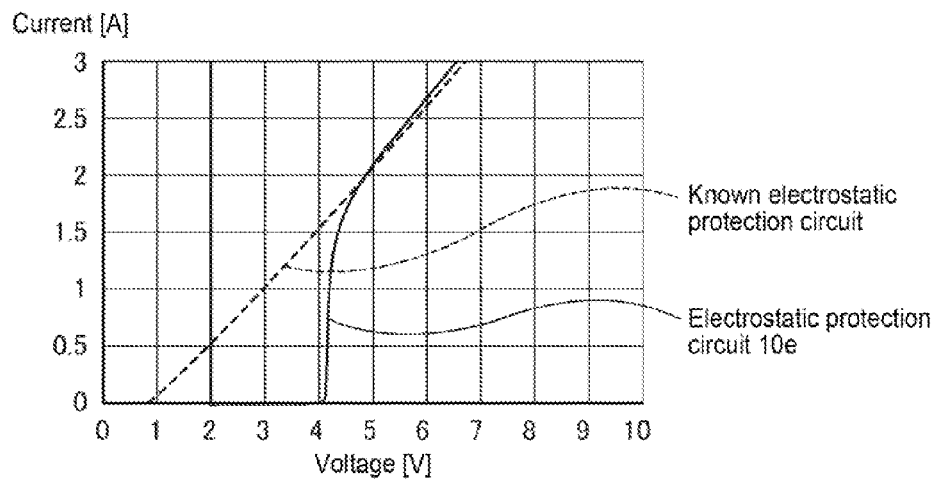
FIG. 8 is a diagram showing the I-V characteristics of the electrostatic protection circuits according to related technology and the third embodiment.

FIG. 8 is a diagram showing a comparison of the I-V characteristics of the known electrostatic protection circuit and the I-V characteristics of the electrostatic protection circuit according to the third embodiment of the invention. In FIG. 8, the horizontal axis indicates the voltage [V] between the two ends of the electrostatic protection circuit, and the vertical axis indicates the current [A] flowing in the discharge path.

As shown in FIG. 8, in the known electrostatic protection circuit, when the voltage between the two ends reaches approximately 1 V, the discharge operation is started, and current starts to flow in the discharge path, and therefore it is easy for mis-operation of the internal circuit to occur when the power supply voltage rises during normal operation. On the other hand, with the electrostatic protection circuit 10e (FIG. 5) according to the third embodiment of the invention, the discharge operation is started after the voltage between the two ends exceeds 4 V, and therefore mis-operation of the internal circuit does not easily occur when the power supply voltage rises during normal operation.

FIG. 9 is a diagram showing the current waveform of electrostatic discharge in a human body model. In FIG. 9, the horizontal axis indicates time [s], and the vertical axis indicates the current [A]. For example, in the case where 2000 V of static electricity is applied by a human body to the semiconductor integrated circuit apparatus, the peak current reaches approximately 1.3 A, and a surge current continues to flow for a duration of approximately 1 µs.

Figure 10:
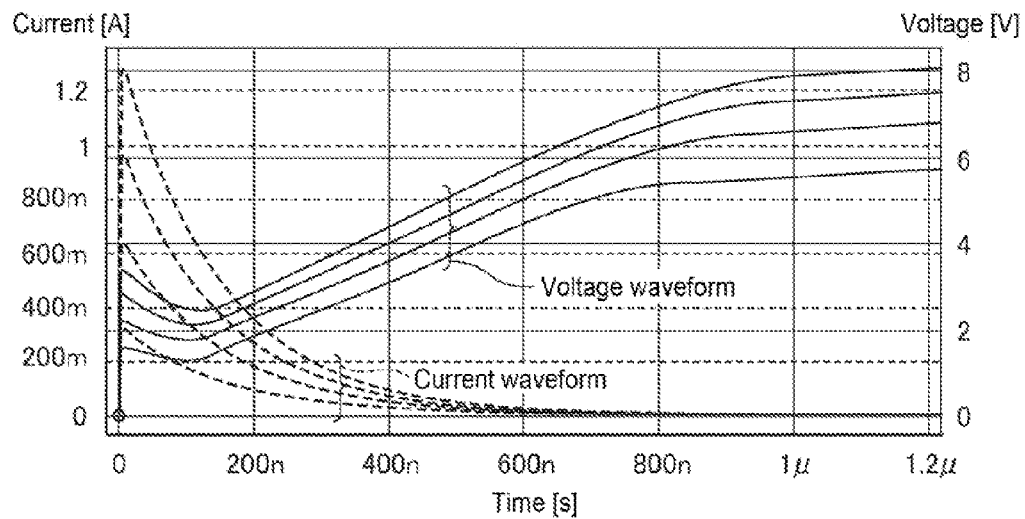
FIG. 10 is a diagram showing current and voltage waveforms of static electricity in a known electrostatic protection circuit.
Figure 11:
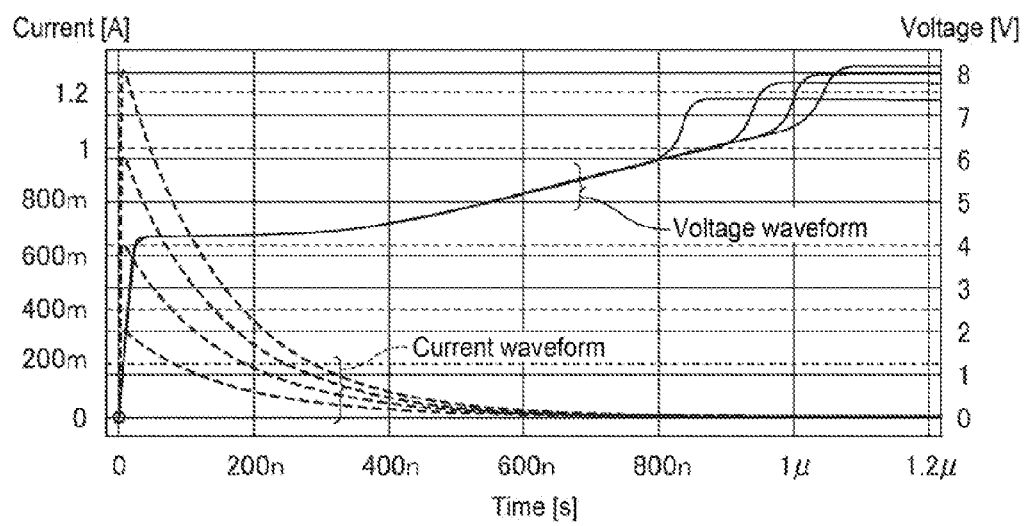
FIG. 11 is a diagram showing current and voltage waveforms of static electricity in the third embodiment.

FIG. 10 is a diagram showing a current waveform (dashed line) and a voltage waveform (solid line) in the known electrostatic protection circuit in the case of applying the human body model shown in FIG. 9. Also, FIG. 11 is a diagram showing a current waveform (dashed line) and a voltage waveform (solid line) in the electrostatic protection circuit according to the third embodiment of the invention in the case of applying the human body model shown in FIG.

9. In FIGS. 10 and 11, the horizontal axis indicates time [s], the vertical axis on the left side indicates the current [A], and the vertical axis on the right side indicates the voltage [V].

In the known electrostatic protection circuit, when a charge is applied due to an electrostatic discharge, discharge is started, and the voltage between the two ends is suppressed to 8 V or lower. In the electrostatic protection circuit 10e (FIG. 5) according to the third embodiment of the invention as well, when a charge is applied due to an electrostatic discharge, discharge is started, and the voltage between the two ends is suppressed to approximately 8 V or lower. Accordingly, it is understood that functionality as an electrostatic protection circuit is proper in both cases.

Figure 12:
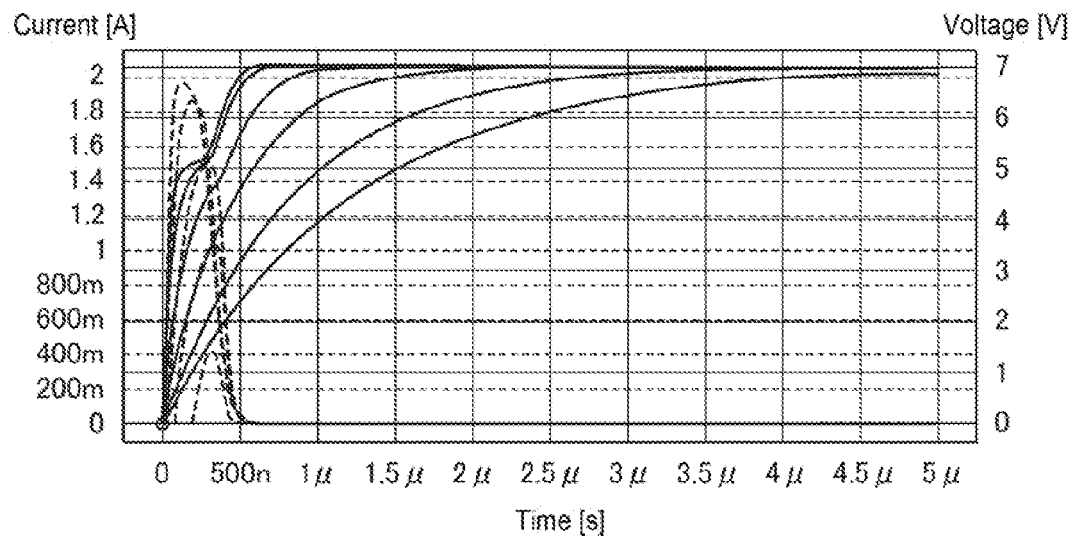
FIG. 12 is a diagram showing current and voltage waveforms at the time of power activation in a known electrostatic protection circuit.
Figure 13:
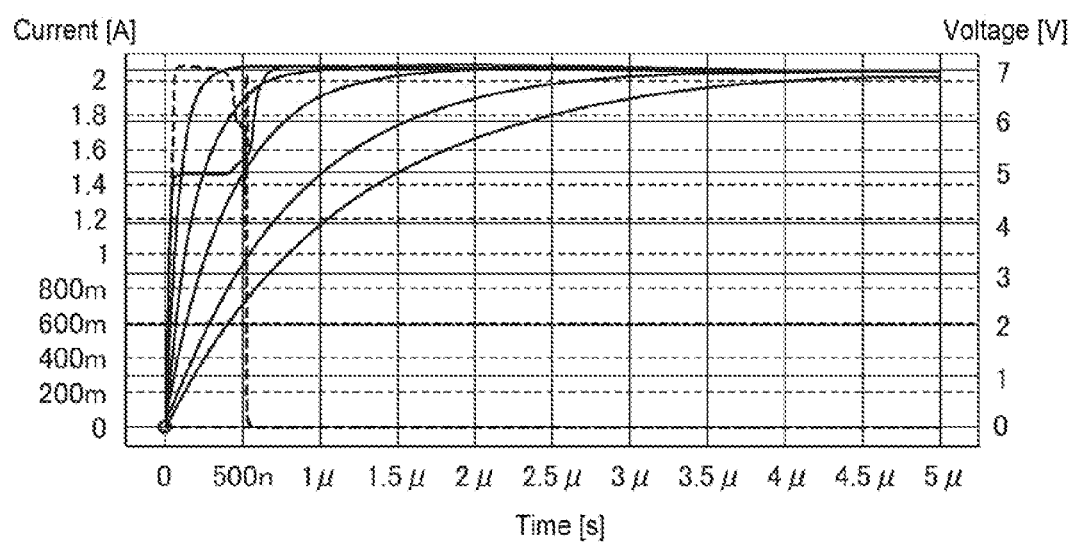
FIG. 13 is a diagram showing current and voltage waveforms at the time of power activation in the third embodiment.

FIG. 12 is a diagram showing a current waveform (dashed line) and a voltage waveform (solid line) at the time of power activation in the known electrostatic protection circuit. Also, FIG. 13 is a diagram showing a current waveform (dashed line) and a voltage waveform (solid line) at the time of power activation in the electrostatic protection circuit according to the third embodiment of the invention. In FIGS. 12 and 13, the horizontal axis indicates time [s], the vertical axis on the left side indicates the current [A], and the vertical axis on the right side indicates the voltage [V]. The six types of waveforms in FIGS. 12 and 13 were obtained by changing the rise time of the power supply voltage to 0.1 µs, 0.2 µs, 0.45 µs, 0.95 µs, 1.85 µs, and 2.75 µs. The steady-state value of the power supply voltage is the absolute maximum rated voltage of 7 V.

The current waveform of the known electrostatic protection circuit shown in FIG. 12 shows that the discharge operation is performed if the rise time of the power supply voltage is 1.85 µs or shorter. Accordingly, the voltage waveform becomes disturbed. This can be a cause of misoperation. On the other hand, the current waveform of the electrostatic protection circuit 10e (FIG. 5) according to the third embodiment of the invention shown in FIG. 13 shows that the discharge operation is not performed unless the rise time of the power supply voltage is 0.1 µs or shorter. Also, even if the discharge operation is performed, when approximately 0.5 µs has elapsed since power activation, the discharge operation stops, and the electrostatic protection circuit 10e enters the normal state.

Fourth Embodiment

Figure 14:
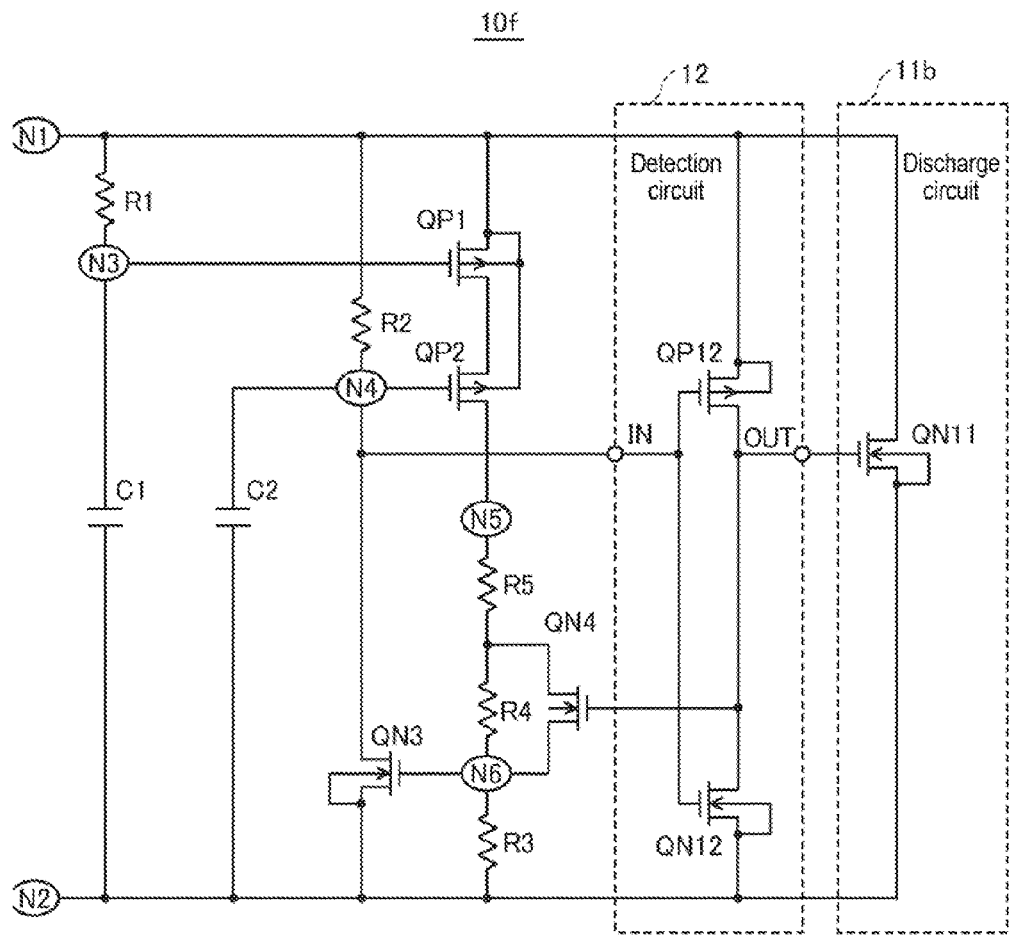
FIG. 14 is a circuit diagram showing an example of a configuration of an electrostatic protection circuit according to a fourth embodiment of the invention.

FIG. 14 is a circuit diagram showing an example of the configuration of an electrostatic protection circuit according to a fourth embodiment of the invention. The electrostatic protection circuit according to the fourth embodiment is the electrostatic protection circuit according to the third embodiment with the addition of a transistor connected in parallel to the resistance element R4, and with the addition of a resistance element R5 as a fifth impedance element. Other aspects in the fourth embodiment are similar to those in the third embodiment. FIG. 14 shows an example of an electrostatic protection circuit 10f with the addition of an N-channel MOS transistor QN4 and a resistance element R5.

The transistor QN4 has a drain connected to one end of the resistance element R4, a source connected to the other end of the resistance element R4, and a gate connected to the output terminal OUT of the detection circuit 12. The transistor QN4 enters the on state when the output signal of the detection circuit 12 is activated with the high level. Also, the resistance element R5 is connected between the node N5 and the drain of the transistor QN4.

The transistor QN4 and the resistance element R5 constitute a voltage-dividing circuit along with the resistance elements R3 and R4. If, due to an application of static electricity, the output signal of the detection circuit 12 is activated with the high level, and the electrostatic protection circuit 10f starts the discharge operation, then the transistor QN4 turns on, and the voltage dividing ratio in the voltage-dividing circuit rises. As a result, the voltage between the node N1 and the node N2 decreases, there is a rise in the margin for the voltage at which damage to the internal circuit of the semiconductor integrated circuit apparatus occurs, and the electrostatic resistance improves.

The hold voltage $V_H$ is the voltage between the node N1 and the node N2 when the transistor QN4 transitions from the on state to the off state, and can be approximated by Expression 4 below.

$$V_H \approx Vth_{QN3} \times (R3+R4+R5)/R3 \quad (4)$$

Here, $Vth_{QN3}$ is the threshold voltage of the transistor QN3, a is a coefficient in the range of 0 to 1, R3 is the resistance value of the resistance element R3, R4 is the resistance value of the resistance element R4, and R5 is the resistance value of the resistance element R5. Note that it is assumed that the resistance values R3 and R4 are values sufficiently larger than the on resistance of the transistors QP1 and QP2. Also, if the resistance element R5 is not provided, then R5=0.

Here, the higher the current flowing through the transistor QN11 of the discharge circuit 11b is, the smaller the on resistance of the transistor QN4 is, and the smaller the value of the coefficient α is. Accordingly, in Expression 4, the higher the current flowing through the transistor QN11 of the discharge circuit 11b is, the smaller the hold voltage $V_H$ is.

Specifically, when the amount of current flowing through the transistor QN11 of the discharge circuit 11b is small, a is set to 1, and the hold voltage $V_H$ is approximated using Expression 5 below.

$$V_H \approx Vth_{QN3} \times (R3+R4+R5)/R3 \quad (5)$$

However, when the amount of current flowing through the transistor QN11 of the discharge circuit 11b is large, a is set to 0, and the hold voltage $V_H$ is approximated using Expression 6 below.

$$V_H \approx Vth_{QN3} \times (R3+R5)/R3 \quad (6)$$

According to Expressions 5 and 6, the hold voltage $V_H$ can be changed within a desired voltage range by setting the resistance values of the resistance elements R3 to R5.

Figure 15:
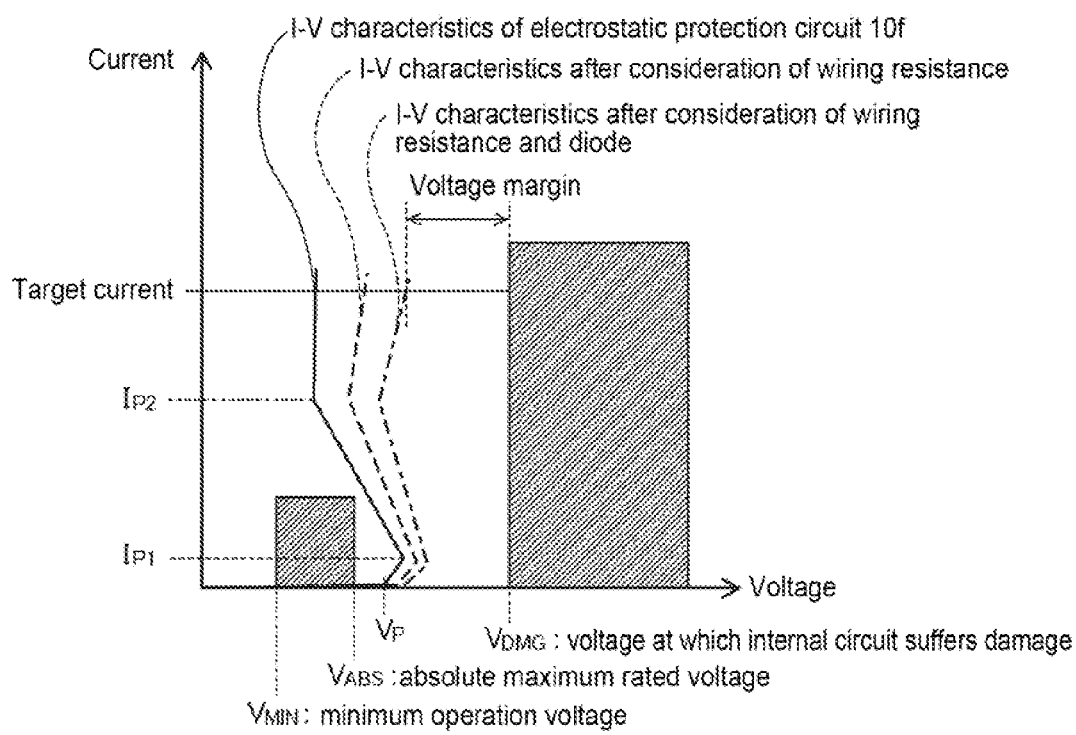
FIG. 15 is a diagram showing the I-V characteristics of the electrostatic protection circuit according to the fourth embodiment.

FIG. 15 is a diagram showing I-V characteristics in the case of applying the electrostatic protection circuit according to the fourth embodiment to the semiconductor integrated circuit apparatus shown in FIG. 1. In FIG. 15, the horizontal axis indicates the voltage between the two ends of the electrostatic protection circuit and the like in the discharge path, and the vertical axis indicates the current flowing in the discharge path.

As shown in FIG. 15, with the electrostatic protection circuit 10f according to the fourth embodiment of the invention, the discharge operation is not started in the region in which the voltage between the two ends is the absolute maximum rated voltage $V_{ABS}$ or less, and therefore current does not flow in the discharge path. On the other hand, if the voltage between the two ends exceeds the predetermined voltage $V_P$, the electrostatic protection circuit 10f starts the discharge operation, and current starts to flow in the discharge path.

In a first operation region in which the current flowing in the discharge path is in the range of a first predetermined current $I_{P1}$ to a second predetermined current $I_{P2}$, the higher the current flowing in the discharge path is, the lower the voltage between the two ends of the electrostatic protection circuit 10f becomes. In a second operation region in which the current flowing in the discharge path exceeds the second predetermined current $I_{P2}$, the electrostatic protection circuit 10f holds the voltage between the two ends at an approximately constant voltage.

Accordingly, even giving consideration to the voltage occurring in the wiring resistance and the diode, when the current flowing in the discharge path has reached the target current, a voltage margin that is higher than in the third embodiment exists between the voltage between the terminals of the semiconductor integrated circuit apparatus and the damage voltage $V_{DMG}$ at which damage to the elements in the internal circuit 20 occurs.

According to the present embodiment, once the electrostatic protection circuit starts the discharge operation due to an application of static electricity, a rise occurs in the voltage dividing ratio in the voltage-dividing circuit constituted by the resistance elements R3 to R5 and the transistor QN4, and therefore the voltage between the node N1 and node N2 decreases, there is a rise in the margin for the damage voltage $V_{DMG}$ at which damage to the internal circuit of the semiconductor integrated circuit apparatus occurs, and the electrostatic resistance improves.

Also, in the present embodiment as well, the hold voltage $V_H$ may be set lower than the absolute maximum rated voltage $V_{ABS}$. For example, it is sufficient that the hold voltage $V_H$ is set greater than or equal to the minimum operation voltage $V_{MIN}$ of the internal circuit 20. During normal operation, if the electrostatic protection circuit performs the discharge operation due to the influence of power supply noise or the like, current flows in the discharge path while the voltage between the two ends of the electrostatic protection circuit 10f remains at a voltage greater than or equal to the minimum operation voltage $V_{MIN}$. Accordingly, a power supply voltage greater than or equal to the minimum operation voltage $V_{MIN}$ is supplied to the internal circuit 20, thus preventing mis-operation of the internal circuit 20. Also, when a time set by the time constant of the first series circuit, which is constituted by the resistance element R1 and the capacitor C1, elapses, the transistor QP1 is forcibly set to the off state, and the discharge operation stops.

Fifth Embodiment

Figure 16:
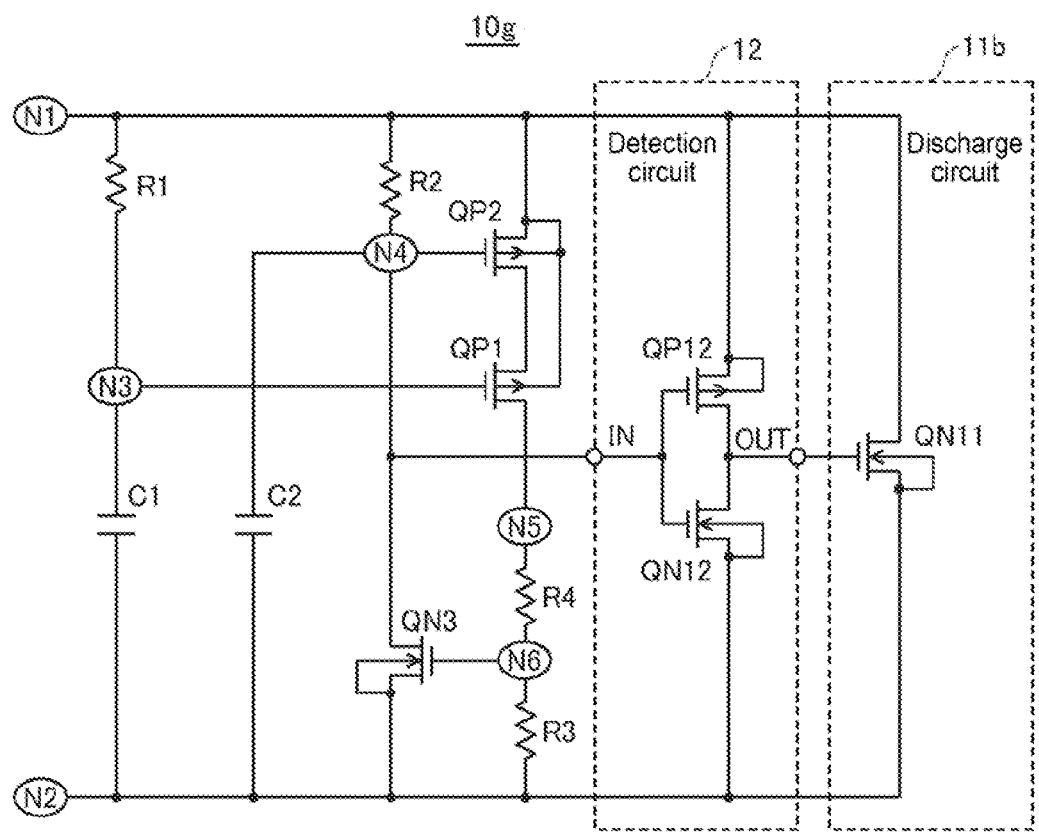
FIG. 16 is a circuit diagram showing an example of a configuration of an electrostatic protection circuit according to a fifth embodiment of the invention.

FIG. 16 is a circuit diagram showing an example of the configuration of an electrostatic protection circuit according to a fifth embodiment of the invention. The electrostatic protection circuit according to the fifth embodiment is the electrostatic protection circuit according to any of the first to fourth embodiments in which the position of the transistor QP1 and the position of the transistor QP2 have been switched, and the operations performed are similar to those of the electrostatic protection circuit according to any of the first to fourth embodiments. FIG. 16 shows an example of an electrostatic protection circuit 10g that is the electrostatic protection circuit according to the third embodiment in which the position of the transistor QP1 and the position of the transistor QP2 have been switched.

Sixth Embodiment

Figure 17:
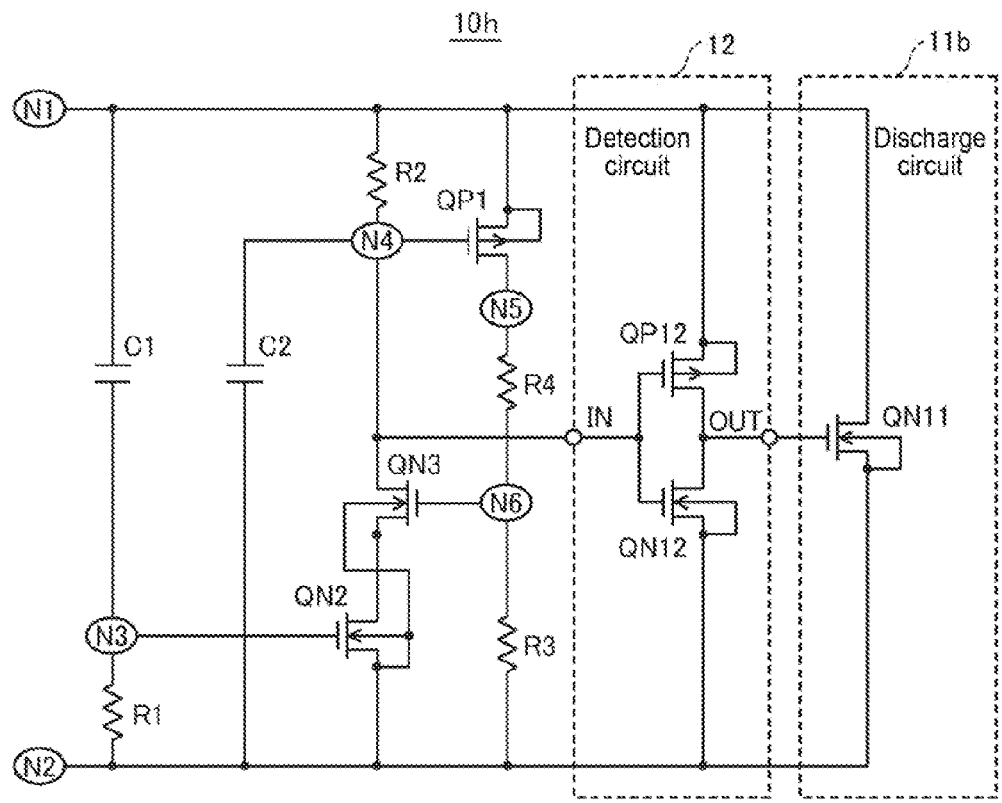
FIG. 17 is a circuit diagram showing an example of a configuration of an electrostatic protection circuit according to a sixth embodiment of the invention.

FIG. 17 is a circuit diagram showing an example of the configuration of an electrostatic protection circuit according to a sixth embodiment of the invention. The electrostatic protection circuit according to the sixth embodiment is the electrostatic protection circuit according to any of the first to fifth embodiments in which one P-channel MOS transistor has been replaced with an N-channel MOS transistor, and the operations performed are similar to those of the electrostatic protection circuit according to any of the first to fifth embodiments. FIG. 17 shows an example of an electrostatic protection circuit 10h that is the electrostatic protection circuit according to the third embodiment in which one P-channel MOS transistor has been replaced with an N-channel MOS transistor.

As shown in FIG. 17, the electrostatic protection circuit 10h includes the capacitors C1 and C2, the resistance elements R1 to R4, the P-channel MOS transistor QP1, the N-channel MOS transistors QN2 and QN3, and the discharge circuit 11b.

The capacitor C1 is connected between the node N1 and the node N3, and the resistance element R1 is connected between the node N3 and the node N2. Also, the resistance element R2 is connected between the node N1 and a node N4, and the capacitor C2 is connected between the node N4 and the node N2.

The transistor QP1 is connected between the node N1 and the node N5. The transistor QP1 has a source connected to the node N1, a drain connected to the node N5, and a gate connected to the node N4. When the node N1 rises to a higher potential than the node N2, the transistor QP1 enters the on state in accordance with the increase in the potential difference occurring between the two ends of the resistance element R2.

The resistance element R4 is connected between the node N5 and the node N6. Also, the resistance element R3 is connected between the node N6 and the node N2. The resistance elements R4 and R3 constitute a voltage-dividing circuit that divides the voltage between the node N5 and the node N2.

The transistors QN2 and QN3 are connected in series between the node N4 and the node N2. The transistor QN2 has a source connected to the node N2 and a gate connected to the node N3. The transistor QN3 has a drain connected to the node N4, a source connected to the drain of the transistor QN2, and a gate connected to the node N6. When the node N1 rises to a higher potential than the node N2, the transistor QN2 enters the on state in accordance with the increase in the potential difference occurring between the two ends of the resistance element R1, and the transistor QN3 enters the on state in accordance with the increase in the potential difference occurring between the two ends of the resistance element R3.

Seventh Embodiment

Figure 18:
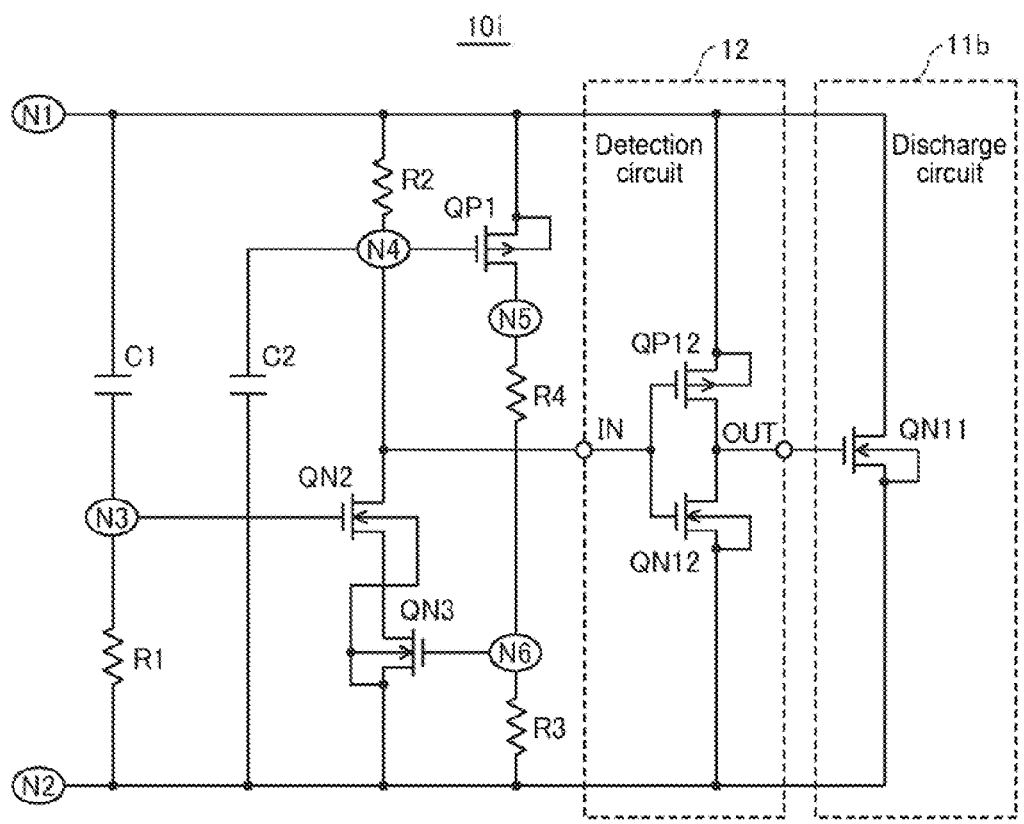
FIG. 18 is a circuit diagram showing an example of a configuration of an electrostatic protection circuit according to a seventh embodiment of the invention.

FIG. 18 is a circuit diagram showing an example of the configuration of an electrostatic protection circuit according to a seventh embodiment of the invention. An electrostatic protection circuit 10i according to the seventh embodiment is the electrostatic protection circuit according to the sixth embodiment in which the position of the transistor QN2 and the position of the transistor QN3 have been switched, and the operations performed are similar to those of the electrostatic protection circuit according to the sixth embodiment.

Eighth Embodiment

Figure 19:
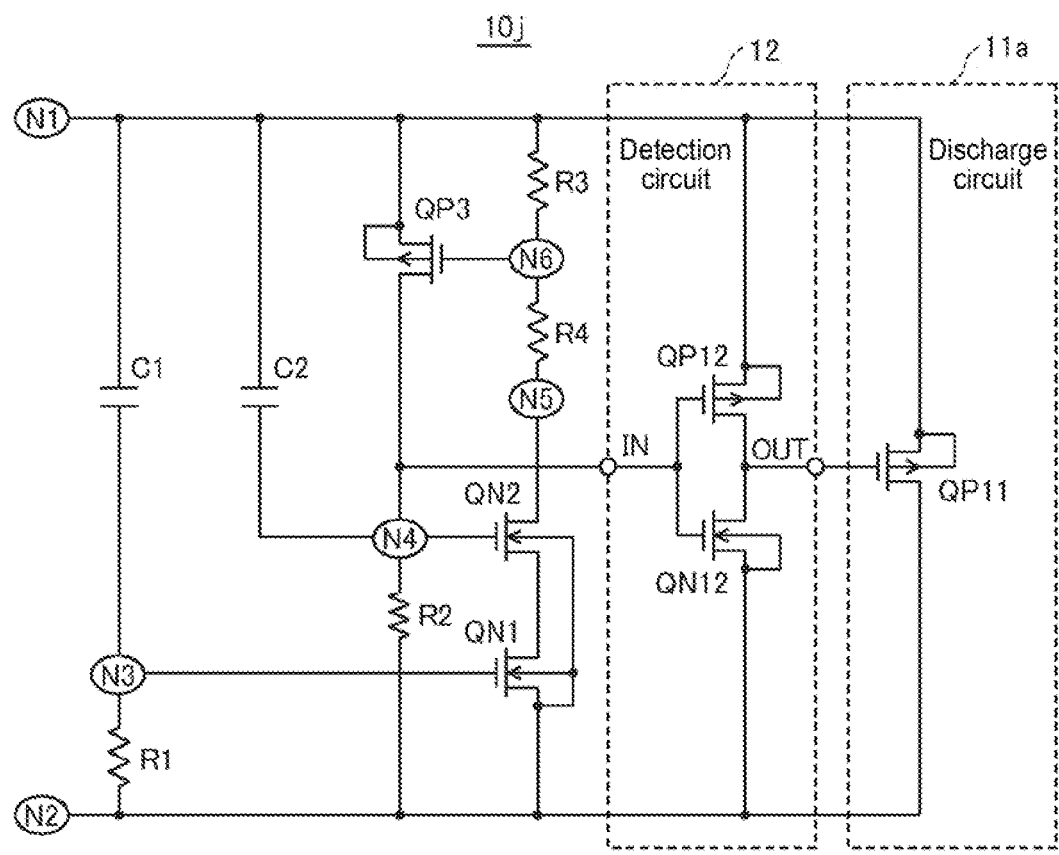
FIG. 19 is a circuit diagram showing an example of a configuration of an electrostatic protection circuit according to an eighth embodiment of the invention.

FIG. 19 is a circuit diagram showing an example of the configuration of an electrostatic protection circuit according to an eighth embodiment of the invention. In the first to seventh embodiments of the invention, P-channel MOS transistors may be switched with N-channel MOS transistors, and the connections of the elements may be changed accordingly. FIG. 19 shows an example of an electrostatic protection circuit 10j that is the electrostatic protection circuit according to the third embodiment in which P-channel MOS transistors have been switched with N-channel MOS transistors.

The electrostatic protection circuit 10j includes the resistance elements R1 to R4 as the first to fourth impedance elements, the capacitors C1 and C2, N-channel MOS transistors QN1 and QN2, a P-channel MOS transistor QP3, the detection circuit 12, and the discharge circuit 11a.

The resistance element R1 is connected between the node N2 and the node N3, and the capacitor C1 is connected between the node N3 and the node N1. Also, the resistance element R2 is connected between the node N2 and the node N4, and the capacitor C2 is connected between the node N4 and the node N1.

The transistors QN1 and QN2 are connected in series between the node N2 and the node N5. The transistor QN1 has a source connected to the node N2 and a gate connected to the node N3. The transistor QN2 has a drain connected to the node N5, a source connected to the drain of the transistor QN1, and a gate connected to the node N4. When the node N1 rises to a higher potential than the node N2, the transistor QN1 enters the on state in accordance with the increase in the potential difference occurring between the two ends of the resistance element R1, and the transistor QN2 enters the on state in accordance with the increase in the potential difference occurring between the two ends of the resistance element R2.

The resistance element R4 is connected between the node N5 and the node N6, and the resistance element R3 is connected between the node N6 and the node N1. The resistance elements R3 and R4 constitute a voltage-dividing circuit that divides the voltage between the node N1 and the node N5. The transistor QP3 is connected between the node N4 and the node N1. The transistor QP3 has a source connected to the node N1, a drain connected to the node N4, and a gate connected to the node N6. When the node N1 rises to a higher potential than the node N2, the transistor QP3 enters the on state in accordance with the increase in the potential difference occurring between the two ends of the resistance element R3.

The following is a specific description of the operation of the electrostatic protection circuit 10j shown in FIG. 19.

If a positive voltage is applied between the node N1 and the node N2 (potential of node N1>potential of node N2), current flows from the node N1 to the node N2 via the first series circuit constituted by the capacitor C1 and the resistance element R1. Accordingly, charging of the capacitor C1 is performed, and the voltage across the resistance element R1 rises. Also, current flows from the node N1 to the node N2 via the second series circuit constituted by the capacitor C2 and the resistance element R2. Accordingly, charging of the capacitor C2 is performed, and the voltage across the resistance element R2 rises.

During normal operation, if the voltage applied between the node N1 and the node N2 gradually rises, the voltage across the resistance element R2 remains smaller than the threshold voltage of the transistor QN2, and the transistor QN2 maintains the off state. However, if the voltage applied between the node N1 and the node N2 steeply rises during normal operation or due to an electrostatic discharge, the voltage across the resistance element R1 rises to the threshold voltage of the transistor QN1 or higher, and the transistor QN1 turns on. Also, the voltage across the resistance element R2 rises to the threshold voltage of the transistor QN2 or higher, and the transistor QN2 turns on. Note that at this time, the potential of the input terminal IN of the detection circuit 12 is at the low level.

Due to the transistors QN1 and QN2 turning on, voltage is applied to the two ends of the voltage-dividing circuit constituted by the resistance elements R3 and R4, and the voltage across the resistance element R3 rises from 0 V. Here, if the voltage between the node N1 and the node N2 is smaller than a predetermined value, the voltage across the resistance element R3 remains smaller than the threshold voltage of the transistor QP3, and the transistor QP3 maintains the off state. On the other hand, if the voltage between the node N1 and the node N2 is the predetermined value or higher, the voltage across the resistance element R3 rises to the threshold voltage of the transistor QP3 or higher, and the transistor QP3 shifts to the on state.

Due to the transistor QP3 turning on, the amount of current flowing through the resistance element R2 increases, and the voltage across the resistance element R2 rises, and therefore the amount of current flowing through the transistor QN2 increases (positive feedback). At the same time, the potential of the input terminal IN of the detection circuit 12 rises to the high level, and the output signal of the detection circuit 12 is activated with the low level. Accordingly, the transistor QP11 of the discharge circuit 11a starts to allow current to flow from the node N1 to the node N2.

Also, due to the increase in the amount of current flowing through the transistor QN2, the amount of current flowing through the resistance elements R3 and R4 increases. As a result, the voltage across the resistance element R3 rises, and therefore the amount of current flowing through the transistor QP3 increases (positive feedback). Accordingly, the voltage across the resistance element R2 rises further. At the same time, the amount of current flowing through the transistor QP11 of the discharge circuit 11a also increases.

As current continues to flow through the transistor QP11 of the discharge circuit 11a, the charge accumulated in the semiconductor integrated circuit apparatus is released, and the voltage between the node N1 and the node N2 falls below the predetermined voltage. Accordingly, the voltage across the resistance element R3 falls below the threshold voltage of the transistor QN3, and therefore the transistor QN3 transitions from the on state to the off state. As a result, the amount of current flowing through the resistance element R2 decreases, and therefore the output signal of the detection circuit 12 is deactivated with the high level, the transistor QP11 of the discharge circuit 11a transitions from the on state to the off state, and the voltage between the node N1 and the node N2 is held at an approximately constant voltage.

Also, when a time set by the time constant of the first series circuit, which is constituted by the capacitor C1 and the resistance element R1, elapses, the transistor QN1 is forcibly set to the off state, and the discharge operation performed by the transistor QP11 of the discharge circuit 11a stops. Accordingly, during normal operation, even if the power supply voltage is applied between the node N1 and the node N2 and the discharge operation starts, it is possible to stop the discharge operation after a predetermined time has elapsed.

Ninth Embodiment

Figure 20:
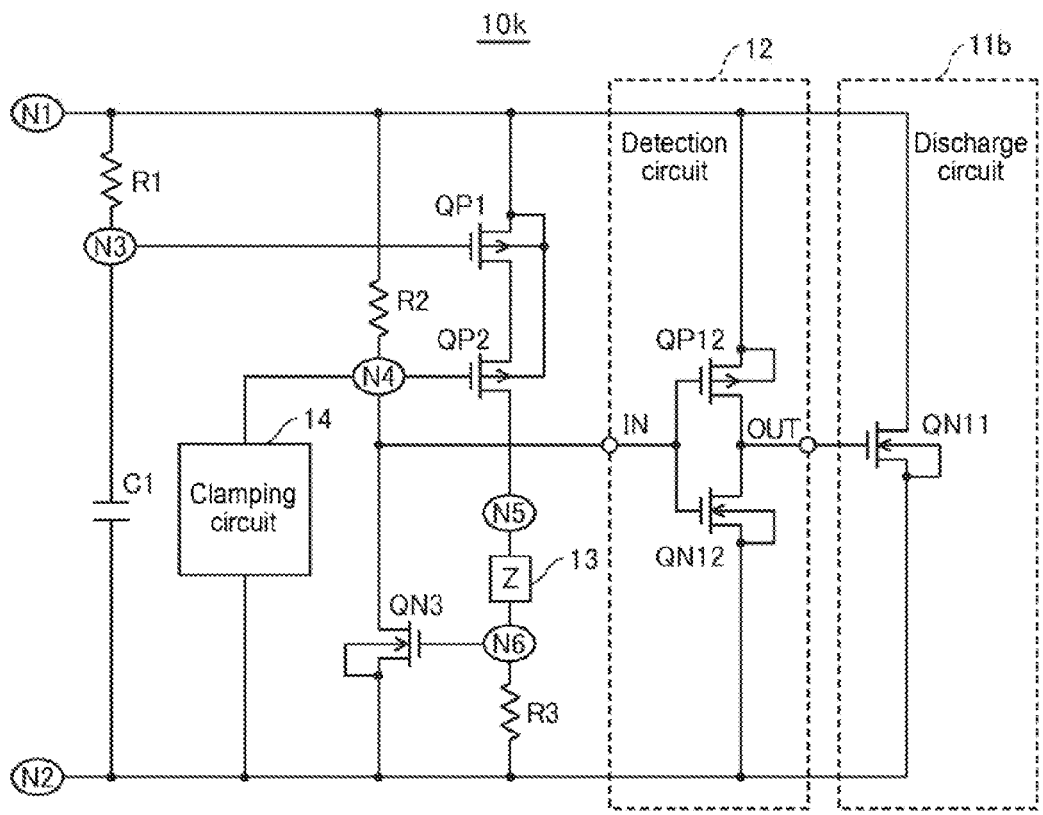
FIG. 20 is a circuit diagram showing an example of a configuration of an electrostatic protection circuit according to a ninth embodiment of the invention.

FIG. 20 is a circuit diagram showing an example of the configuration of an electrostatic protection circuit according to a ninth embodiment of the invention. In the first to eighth embodiments of the invention, an impedance element other than a resistance element may be used in place of at least one resistance element among the resistance elements R1 to R5. Also, a clamping circuit may be used in place of the capacitor C2. Other aspects in the ninth embodiment are similar to those in the first to eighth embodiments. FIG. 20 shows an example of an electrostatic protection circuit 10k that is the electrostatic protection circuit according to the third embodiment shown in FIG. 5 in which the resistance element R4 has been replaced with an impedance element 13, and the capacitor C2 has been replaced with a clamping circuit 14.

As shown in FIG. 20, the electrostatic protection circuit 10k includes the impedance element 13 connected between the node N5 and the node N6, and the clamping circuit 14 connected between the node N4 and the node N2. The impedance element 13 and the resistance element R3 constitute a voltage-dividing circuit that divides the voltage between the node N5 and the node N2.

If a positive high voltage is applied between the node N1 and the node N2, current flows through the clamping circuit 14 via the resistance element R2, and the clamping circuit 14 holds the voltage between the two ends thereof at an approximately constant voltage (hereinafter, also called the "clamp voltage").

The following is a specific description of the operation of the electrostatic protection circuit 10k shown in FIG. 20.

If a positive voltage is applied between the node N1 and the node N2 (potential of node N1>potential of node N2), current flows from the node N1 to the node N2 via the first series circuit constituted by the resistance element R1 and the capacitor C1. Accordingly, the voltage across the resistance element R1 rises, and charging of the capacitor C1 is performed. If the voltage across the resistance element R1 rises to the threshold voltage of the transistor QP1 or higher, the transistor QP1 turns on.

During normal operation, if a positive voltage applied between the node N1 and the node N2 is smaller than the clamp voltage, almost no current flows through the resistance element R2 and the clamping circuit 14, and therefore the voltage across the resistance element R2 remains smaller than the threshold voltage of the transistor QP2, and the transistor QP2 maintains the off state.

On the other hand, if a voltage greater than or equal to the clamp voltage is applied between the node N1 and the node N2 during normal operation or due to an electrostatic discharge, current flows from the node N1 to the node N2 via the resistance element R2 and the clamping circuit 14, and when the voltage across the resistance element R2 rises to the threshold voltage of the transistor QP2 or higher, the transistor QP2 turns on. Note that at this time, the potential of the input terminal IN of the detection circuit 12 is at the high level.

Due to the transistors QP1 and QP2 turning on, a voltage is applied to the two ends of the voltage-dividing circuit constituted by the impedance element 13 and the resistance element R3, and the voltage across the resistance element R3 rises from 0 V. Here, if the voltage between the node N1 and the node N2 is smaller than a predetermined voltage, the voltage across the resistance element R3 remains smaller than the threshold voltage of the transistor QN3, and the transistor QN3 maintains the off state. On the other hand, if the voltage between the node N1 and the node N2 is the predetermined voltage or higher, the voltage across the resistance element R3 rises to the threshold voltage of the transistor QN3 or higher, and the transistor QN3 shifts to the on state.

Due to the transistor QN3 turning on, the amount of current flowing through the resistance element R2 increases, and the voltage across the resistance element R2 rises, and therefore the amount of current flowing through the transistor QP2 increases (positive feedback). At the same time, the potential of the input terminal IN of the detection circuit 12 falls to the low level, and the output signal of the detection circuit 12 is activated with the high level. Accordingly, the transistor QN11 of the discharge circuit 11b starts to allow current to flow from the node N1 to the node N2.

Due to the increase in the amount of current flowing through the transistor QP2, the amount of current flowing through the impedance element 13 and the resistance element R3 increases. As a result, the voltage across the resistance element R3 rises, and therefore the amount of current flowing through the transistor QN3 increases (positive feedback). Accordingly, the voltage across the resistance element R2 rises further. At the same time, the amount of current flowing through the transistor QN11 of the discharge circuit 11b also increases.

As current continues to flow through the transistor QN11 of the discharge circuit 11b, the charge accumulated in the semiconductor integrated circuit apparatus is released, and the voltage between the node N1 and the node N2 falls below the predetermined voltage. Accordingly, the voltage across the resistance element R3 falls below the threshold voltage of the transistor QN3, and therefore the transistor QN3 transitions from the on state to the off state. As a result, the amount of current flowing through the resistance element R2 decreases, and therefore the output signal of the detection circuit 12 is deactivated with the low level, the transistor QN11 of the discharge circuit 11b transitions from the on state to the off state, and the voltage between the node N1 and the node N2 is held at an approximately constant voltage (hold voltage).

Also, when a time set by the time constant of the first series circuit, which is constituted by the resistance element R1 and the capacitor C1, elapses, the transistor QP1 is forcibly set to the off state, and the discharge operation performed by the transistor QN11 of the discharge circuit 11b stops. Accordingly, during normal operation, even if the power supply voltage is applied between the node N1 and the node N2 and the discharge operation starts, it is possible to stop the discharge operation after a predetermined time has elapsed.

In this way, the transition condition used when the transistors QP2 and QN3 transition from the off state to the on state is determined according to whether or not the voltage between the node N1 and the node N2 is greater than or equal to the clamp voltage and the predetermined voltage. However, once the transistors QP2 and QN3 enter the on state, even if the voltage between the node N1 and the node N2 falls below the clamp voltage, the transistors QP2 and QN3 continue to hold the on state if the voltage is higher than the predetermined voltage.

Accordingly, even in the case where the power supply voltage rises steeply due to power activation during normal use, if the voltage between the node N1 and the node N2 is lower than the clamp voltage or the predetermined voltage, there is no risk of the electrostatic protection circuit 10k starting the discharge operation. Also, once the electrostatic protection circuit 10k starts the discharge operation due to the application of static electricity, if the voltage between the node N1 and the node N2 is the predetermined voltage or higher, the electrostatic protection circuit 10k continues the discharge operation for a predetermined time.

Accordingly, the time constant that determines the condition for starting the discharge operation and the time constant that determines the condition for stopping the discharge operation are set individually, and it is possible for the discharge operation to be started only in the case where the applied voltage is the set voltage or higher, and for a charge applied due to an electrostatic discharge to be released without excess or deficiency. Also, when the power supply voltage rises during power activation, it is possible to prevent an excessive discharge operation from being performed, and to ensure a certain power supply voltage or higher.

Tenth Embodiment

Figure 21:
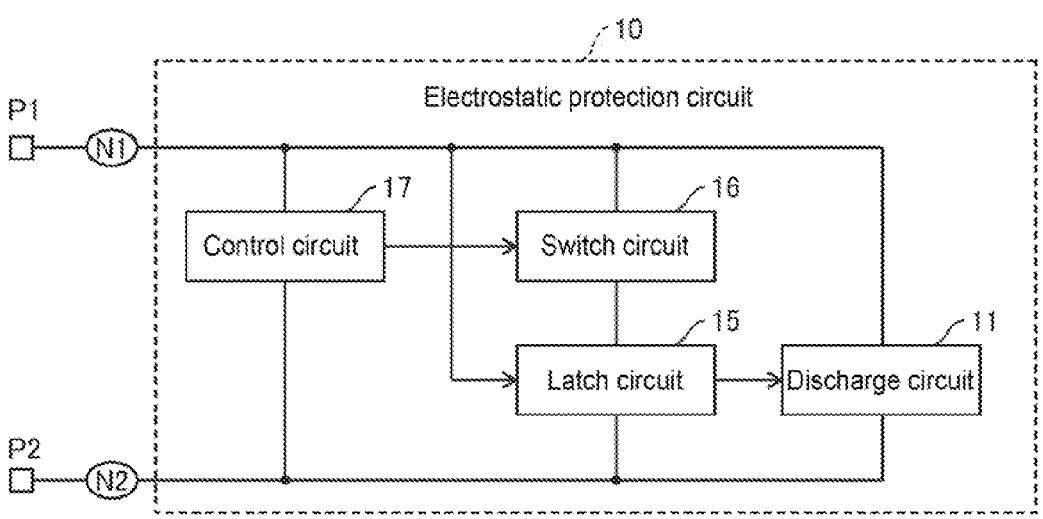
FIG. 21 is a diagram showing an example of a configuration of an electrostatic protection circuit according to a tenth embodiment of the invention.

FIG. 21 is a block diagram showing an example of the configuration of an electrostatic protection circuit according to a tenth embodiment of the invention. As shown in FIG. 21, the electrostatic protection circuit 10 is connected to a first terminal P1 via a node N1, and is connected to a second terminal P2 via a node N2. The electrostatic protection circuit 10 includes a discharge circuit 11, a latch circuit 15, a switch circuit 16, and a control circuit 17.

The discharge circuit 11 is connected between the node N1 and the node N2, and allows current to flow from the node N1 to the node N2 by performing a discharge operation in accordance with a signal output from the latch circuit 15. When static electricity is applied to the first terminal P1 or the second terminal P2, the latch circuit 15 latches the signal for causing the discharge circuit 11 to operate, and outputs the latched signal to the discharge circuit 11.

The switch circuit 16 is, for example, connected between the node N1 and the latch circuit 15, and controls the latch circuit 15 using an open/close operation. When a predetermined time has elapsed since static electricity was applied to the first terminal P1 or the second terminal P2, the control circuit 17 sets the switch circuit 16 to the off state so as to stop the operation of the latch circuit 15.

As one example, the discharge circuit 11 may be constituted by the discharge circuit 11a or 11b shown in FIG. 3A or the like. The latch circuit 15 may be constituted by the resistance elements R2 to R5 shown in FIG. 3A and the like, the impedance element 13, the capacitor C2, the clamping circuit 14, the transistors QP2 and QN3, the transistors QP1 and QN3 (FIGS. 17 and 18), or the transistors QN2 and QP3 (FIG. 19). The switch circuit 16 may be constituted by the transistor QP1 shown in FIGS. 3A and the like, the transistor QN2 (FIGS. 17 and 18), or the transistor QN1 (FIG. 19). The control circuit 17 may be constituted by the resistor R1 and the capacitor C1 shown in FIG. 3A and the like.

The electrostatic protection circuit 10 according to the present embodiment is provided with the latch circuit 15 that causes the discharge operation to start when static electricity has been applied to the first terminal P1 or the second terminal P2, and the control circuit 17 that causes the discharge operation to stop after a predetermined time has elapsed since static electricity was applied to the first terminal P1 or the second terminal P2. Accordingly, the condition for starting the discharge operation and the condition for stopping the discharge operation are set individually, and it is possible for the discharge operation to be started only in the case where a rise in the applied voltage is steep or the case where the applied voltage is the set voltage or higher, and for a charge applied due to an electrostatic discharge to be released without excess or deficiency.

Impedance Element Examples

FIGS. 22A to 22H are diagrams showing examples of impedance elements other than resistance elements that can be used in embodiments of the invention. In the embodiments of the invention, it is possible to use the impedance elements shown in FIGS. 22A to 22H in place of at least one resistance element among the resistance elements R1 to R5 shown in FIGS. 3A to 20. Note that in FIGS. 22A to 22H, "N+" indicates a node on the high potential side, and "N−" indicates a node on the low potential side.

Figure 22A:
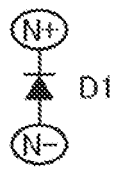
FIG. 22A is a diagram showing an example of impedance elements that can be used in embodiments of the invention.

FIG. 22A shows a diode D1 that has a cathode connected to the node N+ on the high potential side and an anode connected to the node N− on the low potential side. When current flows from the node N+ to the node N− via the diode D1, the voltage between the node N+ and the node N− becomes the same as the breakdown voltage of the diode D1.

Figure 22B:
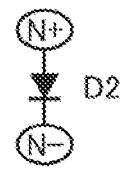
FIG. 22B is a diagram showing an example of impedance elements that can be used in embodiments of the invention.

FIG. 22B shows a diode D2 that has an anode connected to the node N+ on the high potential side and a cathode connected to the node N− on the low potential side. When current flows from the node N+ to the node N− via the diode D2, the voltage between the node N+ and the node N− becomes the same as the forward voltage of the diode D2.

Figure 22C:
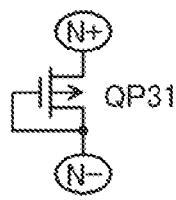
FIG. 22C is a diagram showing an example of impedance elements that can be used in embodiments of the invention.

FIG. 22C shows a P-channel MOS transistor QP31 that has a source connected to the node N+ on the high potential side and a drain and a gate connected to the node N− on the low potential side. When current flows from the node N+ to the node N− via the transistor QP31, the voltage between the node N+ and the node N− becomes the same as the threshold voltage of the transistor QP31.

Figure 22D:
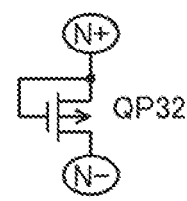
FIG. 22D is a diagram showing an example of impedance elements that can be used in embodiments of the invention.

FIG. 22D shows a P-channel MOS transistor QP32 that has a source and gate connected to the node N+ on the high potential side and a drain connected to the node N− on the low potential side. When current flows from the node N+ to the node N− via the transistor QP32, the voltage between the node N+ and the node N− becomes the same as the breakdown voltage of the transistor QP32.

Figure 22E:
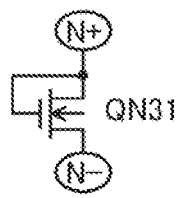
FIG. 22E is a diagram showing an example of impedance elements that can be used in embodiments of the invention.

FIG. 22E shows an N-channel MOS transistor QN31 that has a drain and gate connected to the node N+ on the high potential side and a source connected to the node N− on the low potential side. When current flows from the node N+ to the node N− via the transistor QN31, the voltage between the node N+ and the node N− becomes the same as the threshold voltage of the transistor QN31.

Figure 22F:
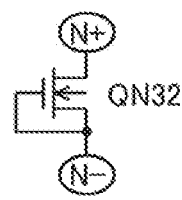
FIG. 22F is a diagram showing an example of impedance elements that can be used in embodiments of the invention.

FIG. 22F shows an N-channel MOS transistor QN32 that has a drain connected to the node N+ on the high potential side and a source and gate connected to the node N− on the low potential side. When current flows from the node N+ to the node N− via the transistor QN32, the voltage between the node N+ and the node N− becomes the same as the breakdown voltage of the transistor QN32.

Figure 22G:
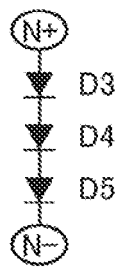
FIG. 22G is a diagram showing an example of impedance elements that can be used in embodiments of the invention.

FIG. 22G shows an example in which the impedance element includes multiple devices that are the same. This impedance element includes three diodes D3 to D5 that are connected in series. The anode of the diode D3 is connected to the node N+ on the high potential side, and the cathode of the diode D5 is connected to the node N− on the low potential side. When current flows from the node N+ to the node N− via the diodes D3 to D5, the voltage between the node N+ and the node N− becomes the same as the sum of the forward voltages of the diodes D3 to D5.

Figure 22H:
FIG. 22H is a diagram showing an example of impedance elements that can be used in embodiments of the invention.

FIG. 22H shows an example in which the impedance element includes multiple devices that are different. This impedance element includes a diode D6 and a resistance element R6 that are connected in series. The cathode of the diode D6 is connected to the node N+ on the high potential side, and one end of the resistance element is connected to the node N− on the low potential side. When current flows from the node N+ to the node N− via the diode D6 and the resistance element R6, the voltage between the node N+ and the node N− becomes the same as the sum of the breakdown voltage of the diode D6 and the product of the resistance value of the resistance element R6 and the current.

In this way, the characteristics of the electrostatic protection circuit can be set freely by selecting appropriate devices from among resistance elements, diodes, and transistors, or by combining multiple devices, and it possible to provide an electrostatic protection circuit that is not easily influenced by process variation.

Clamping Circuit Examples

The elements shown in FIGS. 22A to 22H can also be used as the clamping circuit 14 (FIG. 20) in the embodiments of the invention. Furthermore, it is also possible to use a clamping circuit 14 that, as shown in FIG. 23, includes any of the elements shown by FIGS. 22A to 22G and a capacitor connected in parallel.

Discharge Circuit Examples

In the discharge circuit of the electrostatic protection circuit according to the embodiments of the invention, besides a MOS transistor (Metal Oxide Semiconductor FET (Field Effect Transistor)), it is possible to use a three-terminal element, circuit, or the like that has a function of allowing a current to flow and a has a terminal for switching the current on and off.

Examples of three-terminal elements include a junction field effect transistor (Junction FET), a metal semiconductor field effect transistor (Metal Semiconductor FET), a bipolar transistor, and a thyristor. These three-terminal elements can be used not only as a discharge circuit, but also in place of other MOS transistors as well.

FIGS. 24A and 24B are diagrams showing examples of three-terminal elements other than a MOS transistor that can be used in the discharge circuit. Note that in FIGS. 24A and 24B, "NS" indicates the node to which the output signal of the detection circuit is supplied.

A PNP bipolar transistor QB1 shown in FIG. 24A can be used in place of the P-channel MOS transistor QP1 of the discharge circuit 11a shown in FIG. 3A and the like. The transistor QB1 has an emitter connected to the node N1, a collector connected to the node N2, and a base connected to the node NS.

Also, an NPN bipolar transistor QB2 shown in FIG. 24B can be used in place of the N-channel MOS transistor QN1 of the discharge circuit 11b shown in FIG. 3B and the like. The transistor QB2 has an emitter connected to the node N1, a collector connected to the node N2, and a base connected to the node NS.

The invention is not intended to be limited to the embodiments described above, and many variations can be made within the technical idea of the invention by a person with ordinary knowledge in the technical field of the invention.

The entire disclosure of Japanese Patent Application No. 2014-237948, filed Nov. 25, 2014 is expressly incorporated by reference herein.

What is claimed is:

1. An electrostatic protection circuit that is connected to a first terminal via a first node and connected to a second terminal via a second node, and when static electricity is applied to the first terminal or the second terminal, discharges charge produced by the static electricity, the electrostatic protection circuit comprising:

a discharge circuit that is connected between the first node and the second node, and discharges the charge produced by the static electricity;

a latch circuit that is connected between the first node and the second node, and outputs a signal that controls operation of the discharge circuit to the discharge circuit;

a switch circuit that is connected to the latch circuit and changes the signal that controls operation of the discharge circuit;

a control circuit that is connected between the first node and the second node, and outputs a signal that controls operation of the switch circuit to the switch circuit;

a first impedance element connected between a third node and one out of the first and second nodes;

a first capacitor connected between the third node and another one out of the first and second nodes;

a second impedance element connected between a fourth node and the one out of the first and second nodes;

a second capacitor or a clamping circuit connected between the fourth node and the other one out of the first and second nodes;

a first transistor and a second transistor that are connected in series between a fifth node and the one out of the first and second nodes, where if the first node reaches a higher potential than the second node, the first transistor enters a conductive state in accordance with an increase in a potential difference occurring between two ends of the first impedance element, and the second transistor enters a conductive state in accordance with a potential difference occurring between two ends of the second impedance element;

a third impedance element connected between the fifth node and the other one out of the first and second nodes; and a third transistor that is connected between the fourth node and the other one out of the first and second nodes, and, if the first node reaches a higher potential than the second node, enters a conductive state in accordance with an increase in a potential difference occurring between two ends of the third impedance element, wherein if the first node reaches a higher potential than the second node, the discharge circuit allows current to flow from the first node to the second node in accordance with an increase in the potential difference occurring between the two ends of the second or third impedance element.

2. The electrostatic protection circuit according to claim 1, wherein a time constant of a first series circuit constituted by the first impedance element and the first capacitor is larger than a time constant of a second series circuit constituted by the second impedance element and the second capacitor.

3. The electrostatic protection circuit according to claim 2, wherein the time constant of the first series circuit is 200 ns or larger, and the time constant of the second series circuit is 50 ns or smaller.

4. The electrostatic protection circuit according to claim 1, further comprising:

a detection circuit that, if the first node reaches a higher potential than the second node, activates an output signal in accordance with the potential difference occurring between the two ends of the second or third impedance element, wherein the discharge circuit allows current to flow from the first node to the second node if the output signal of the detection circuit is activated.

5. The electrostatic protection circuit according to claim 1, further comprising:
a fourth impedance element connected between the fifth node and a sixth node,
wherein the third impedance element is connected between the sixth node and the other one out of the first and second nodes.

6. The electrostatic protection circuit according to claim 4, further comprising:
a fourth impedance element connected between the fifth node and a sixth node; and
a fourth transistor that is connected in parallel to the fourth impedance element, and enters a conductive state if the output signal of the detection circuit is activated,
wherein the third impedance element is connected between the sixth node and the other one out of the first and second nodes.

7. A semiconductor integrated circuit apparatus comprising an internal circuit and the electrostatic protection circuit according to claim 5 that protects the internal circuit from static electricity,
wherein a hold voltage of the electrostatic protection circuit is set to a minimum operation voltage of the internal circuit or higher.

8. A semiconductor integrated circuit apparatus comprising the electrostatic protection circuit according to claim 1.

9. An electrostatic protection circuit that is connected to a first terminal via a first node and connected to a second terminal via a second node, and when static electricity is applied to the first terminal or the second terminal, discharges charge produced by the static electricity, the electrostatic protection circuit comprising:
a discharge circuit that is connected between the first node and the second node, and discharges the charge produced by the static electricity;
a latch circuit that is connected between the first node and the second node, and outputs a signal that controls operation of the discharge circuit to the discharge circuit;
a switch circuit that is connected to the latch circuit and changes the signal that controls operation of the discharge circuit;
a control circuit that is connected between the first node and the second node, and outputs a signal that controls operation of the switch circuit to the switch circuit;
a first capacitor connected between a third node and one out of the first and second nodes;
a first impedance element connected between the third node and another one out of the first and second nodes;
a second impedance element connected between a fourth node and the one out of the first and second nodes;
a second capacitor or a clamping circuit connected between the fourth node and the other one out of the first and second nodes;
a first transistor that is connected between a fifth node and the one out of the first and second nodes, and, if the first node reaches a higher potential than the second node, enters a conductive state in accordance with an increase in a potential difference occurring between two ends of the second impedance element;
a third impedance element connected between the fifth node and the other one out of the first and second nodes; and
a second transistor and a third transistor that are connected in series between the fourth node and the other one out of the first and second nodes, where if the first node reaches a higher potential than the second node, the second transistor enters a conductive state in accordance with an increase in a potential difference occurring between two ends of the first impedance element, and the third transistor enters a conductive state in accordance with a potential difference occurring between two ends of the third impedance element,
wherein if the first node reaches a higher potential than the second node, the discharge circuit allows current to flow from the first node to the second node in accordance with an increase in the potential difference occurring between the two ends of the second or third impedance element.

10. The electrostatic protection circuit according to claim 9, wherein a time constant of a first series circuit constituted by the first impedance element and the first capacitor is larger than a time constant of a second series circuit constituted by the second impedance element and the second capacitor.

11. The electrostatic protection circuit according to claim 10, wherein the time constant of the first series circuit is 200 ns or larger, and the time constant of the second series circuit is 50 ns or smaller.

12. The electrostatic protection circuit according to claim 9, further comprising:
a detection circuit that, if the first node reaches a higher potential than the second node, activates an output signal in accordance with the potential difference occurring between the two ends of the second or third impedance element,
wherein the discharge circuit allows current to flow from the first node to the second node if the output signal of the detection circuit is activated.

13. The electrostatic protection circuit according to claim 9, further comprising:
a fourth impedance element connected between the fifth node and a sixth node,
wherein the third impedance element is connected between the sixth node and the other one out of the first and second nodes.

14. The electrostatic protection circuit according to claim 12, further comprising:
a fourth impedance element connected between the fifth node and a sixth node; and
a fourth transistor that is connected in parallel to the fourth impedance element, and enters a conductive state if the output signal of the detection circuit is activated,
wherein the third impedance element is connected between the sixth node and the other one out of the first and second nodes.

15. A semiconductor integrated circuit apparatus comprising an internal circuit and the electrostatic protection circuit according to claim 13 that protects the internal circuit from static electricity,
wherein a hold voltage of the electrostatic protection circuit is set to a minimum operation voltage of the internal circuit or higher.

* * * * *